United States Patent
Chen et al.

(10) Patent No.: US 11,749,602 B2
(45) Date of Patent: Sep. 5, 2023

(54) TOPOLOGICAL SEMI-METAL INTERCONNECTS

(71) Applicant: International Business Machines Corporation, Armonk, NY (US)

(72) Inventors: Ching-Tzu Chen, Ossining, NY (US); Nicholas Anthony Lanzillo, Wynantskill, NY (US); Vijay Narayanan, New York, NY (US); Takeshi Nogami, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/950,453

(22) Filed: Nov. 17, 2020

(65) Prior Publication Data
US 2022/0157733 A1    May 19, 2022

(51) Int. Cl.
| H01L 23/532 | (2006.01) |
| H01L 23/522 | (2006.01) |
| H01L 21/3213 | (2006.01) |
| H01L 21/768 | (2006.01) |
| H01L 23/528 | (2006.01) |

(52) U.S. Cl.
CPC .... *H01L 23/53209* (2013.01); *H01L 21/3213* (2013.01); *H01L 21/76831* (2013.01); *H01L 23/5226* (2013.01); *H01L 23/5283* (2013.01)

(58) Field of Classification Search
CPC ........... H01L 23/5226; H01L 23/53209; H01L 23/5283; H01L 21/3213; H01L 21/76831
See application file for complete search history.

(56) References Cited

U.S. PATENT DOCUMENTS

| 5,512,514 A | 4/1996 | Lee |
| 5,693,568 A | 12/1997 | Liu et al. |
| 8,299,625 B2 | 10/2012 | Ponoth et al. |
| 8,357,609 B2 | 1/2013 | Ryan |
| 9,362,227 B2 | 6/2016 | Zhang et al. |
| 9,613,905 B2 | 4/2017 | Yazdani et al. |
| 2002/0155693 A1 | 10/2002 | Hong et al. |

(Continued)

FOREIGN PATENT DOCUMENTS

| CN | 101399219 A | 4/2009 |
| CN | 105006485 A | 10/2015 |
| WO | 2018146307 A1 | 8/2018 |

OTHER PUBLICATIONS

International Search Report and Written Opinion, International Application No. PCT/CN2021/129432, dated Feb. 10, 2022, 8 pgs.

(Continued)

*Primary Examiner* — Jaehwan Oh
*Assistant Examiner* — John M Parker
(74) *Attorney, Agent, or Firm* — Robert J. Shatto

(57) ABSTRACT

Provided is a method for fabricating an interconnect. The method comprises forming a topological semi-metal layer. The method further comprises patterning the topological semi-metal layer to form one or more interconnects. The method further comprises forming a dielectric layer between the one or more interconnects. The method further comprises forming a hermetic dielectric cap layer on top of the one or more interconnects and the dielectric layer.

9 Claims, 20 Drawing Sheets

(56) References Cited

U.S. PATENT DOCUMENTS

| | | | | |
|---|---|---|---|---|
| 2005/0121793 | A1* | 6/2005 | Liaw | H10B 10/00 |
| | | | | 257/E23.079 |
| 2008/0205126 | A1* | 8/2008 | Kajiyama | G11C 11/16 |
| | | | | 365/158 |
| 2012/0161209 | A1 | 6/2012 | Yazdani et al. | |
| 2012/0252206 | A1 | 10/2012 | Naik et al. | |
| 2013/0187273 | A1 | 7/2013 | Zhang et al. | |
| 2018/0026185 | A1* | 1/2018 | Chan | G01J 5/10 |
| | | | | 250/338.4 |
| 2018/0366633 | A1 | 12/2018 | Fu et al. | |
| 2019/0067547 | A1* | 2/2019 | Gooth | H01L 35/00 |
| 2019/0244646 | A1* | 8/2019 | Lee | H01F 10/329 |
| 2019/0385655 | A1* | 12/2019 | Lin | H01L 43/10 |
| 2019/0386120 | A1* | 12/2019 | Lin | H01F 10/329 |
| 2019/0386208 | A1* | 12/2019 | Lin | H01L 43/08 |
| 2020/0044137 | A1 | 2/2020 | Schueffelgen et al. | |
| 2020/0161535 | A1* | 5/2020 | Lin | H01L 43/08 |
| 2020/0212291 | A1* | 7/2020 | Lin | H01F 10/3218 |
| 2020/0235055 | A1* | 7/2020 | Hegde | H01L 21/76858 |
| 2020/0328283 | A1* | 10/2020 | Liang | H01L 29/66742 |

OTHER PUBLICATIONS

Armitage et al., "Weyl and Dirac semimetals in three-dimensional solids", Reviews of Modern Physics, vol. 90, Jan.-Mar. 2018, 57 pgs.

Belopolski et al., "Discovery of topological Weyl fermion lines and drumhead surface states in a room temperature magnet," Science 365, pp. 1278-1281 (2019).

Bradlyn et al. "Beyond Dirac and Weyl fermions: unconventional quasiparticles in conventional crystals", Science, vol. 353, Issue 6299, Aug. 5, 2016, 9 pgs.

Breitkreiz et al., "Large contribution of Fermi arcs to the conductivity of topological metals", arXiv:1903.12537v2 [cond-mat-meshall] Aug. 16, 2019, 7 pgs.

Burkov et al., "Topological nodal semimetals," Physical Review B 84, 235126 (2011), 14 pgs.

Bzdusek et al., "Nodal-chain metals," Nature, vol. 538, pp. 75-78 (2016).

Chang et al., "Magnetic and noncentrosymmetricWeyl fermion semimetals in the RAlGe family of compounds," Physical Review B 97, 041104(R) (2018), 7 pgs.

Chang et al., "Topological quantum properties of chiral crystals," Nature Materials, vol. 17, pp. 978-985 (2018).

Chang et al., "Unconventional chiral fermions and large topological Fermi arcs in RhSi". Phys. Rev. Lett. 119, 206401 (2017), 6 pgs.

Cheng et al., "Top Via Interconnect with Self-Aligned Barrier Layer," U.S. Appl. No. 16/738,529, filed Jan. 9, 2020.

Josell et al., "Size-Dependent Resistivity in Nanoscale Interconnects", Annu. Rev. Mater. Res. 39, pp. 231-254 (2009).

Kuroda et al., "Evidence for magnetic Weyl fermions in a correlated metal Mn3Sn", Nature Materials, vol. 16, pp. 1090-1095(2017).

Lee et al. "Fermi surface interconnectivity and topology in Weyl fermion semimetals TaAs, TaP, NbAs, and NbP," arXiv:1508.05999v1 [cond-mat-mes-hall] Aug. 24, 2015, 11 pgs.

Liu et al., "Magnetic Weyl semimetal phase in a Kagomé crystal," Co3Sn2S2 Science 365, 1282-1285 (2019), 5 pgs.

Ma et al., "Spin fluctuation induced Weyl semimetal state in the paramagnetic phase of EuCd2As2", Science Advances vol. 5, No. 7, eaaw4718 (2019), 9 pgs.

Park et al., "Back End of Line Metallization," U.S. Appl. No. 16/840,506, filed Apr. 6, 2020.

Rao et al. "Observation of unconventional chiral fermions with long Fermi arcs in CoSi", Nature, vol. 567, pp. 496-499 (2019).

Resta et al., "High Surface Conductivity of Fermi Arc Electrons in Weyl semimetals", arXiv:1708.02415v1 [cond-mat-mes-hall] Aug. 8, 2017, 15 pgs.

Sanchez et al., "Topological chiral crystals with helicoid-arc quantum states", Nature, vol. 567, pp. 500-505 (2019).

Schroter et al., "Chiral topological semimetal with multifold band crossings and long Fermi arcs", Nature Physics, vol. 15, pp. 759-765 (2019).

Song et al. "Electrically Robust Single-Crystalline WTe2 Nanobelts for Nanoscale Electrical Interconnects," Advanced Science 6, No. 3 (2019): 1801370, 9 pgs.

Song et al. "Wafer-scale production of patterned transition metal ditelluride layers for two-dimensional metal-semiconductor contacts at the Schottky-Mott limit." Nature Electronics 3, No. 4 (2020): 207-215.

Zhang et al., "Ultrahigh conductivity in Weyl semimetal NbAs nanobelt ", Nature Materials 18, 482-489 (2019).

Zhu et al., "Triple Point Topological Metals," Physical Review X 6, 031003 (2016). 15 pgs.

* cited by examiner

TOPOLOGICAL SEMI-METAL INTERCONNECTS

BACKGROUND

The present disclosure relates to the electrical, electronic, and computer fields. In particular, the present disclosure relates to topological semi-metal interconnects and methods of manufacturing the same.

In semiconductor fabrication, after the semiconductor devices have been created, they are connected to each other to form the desired electrical circuits. This is done in a series of steps that are collectively referred to as back-end-of-line (BEOL) processing. BEOL processing involves creating various metal interconnects (e.g., wires and vias), isolated from each other by dielectric layers, to connect the semiconductor devices together.

SUMMARY

Embodiments of the present disclosure include a method for fabricating an interconnect. The method comprises forming a topological semi-metal layer. The method further comprises patterning the topological semi-metal layer to form one or more interconnects. The method further comprises forming a dielectric layer between the one or more interconnects. The method further comprises forming a hermetic dielectric cap layer on top of the one or more interconnects and the dielectric layer.

Additional embodiments of the present disclosure include a semiconductor device. The semiconductor device comprises one or more back-end-of-line interconnects. The one or more back-end-of-line interconnects include a topological semi-metal conductor.

Additional embodiments of the present disclosure include an interconnect. The interconnect comprises a topological semi-metal material.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

Figure 1A:
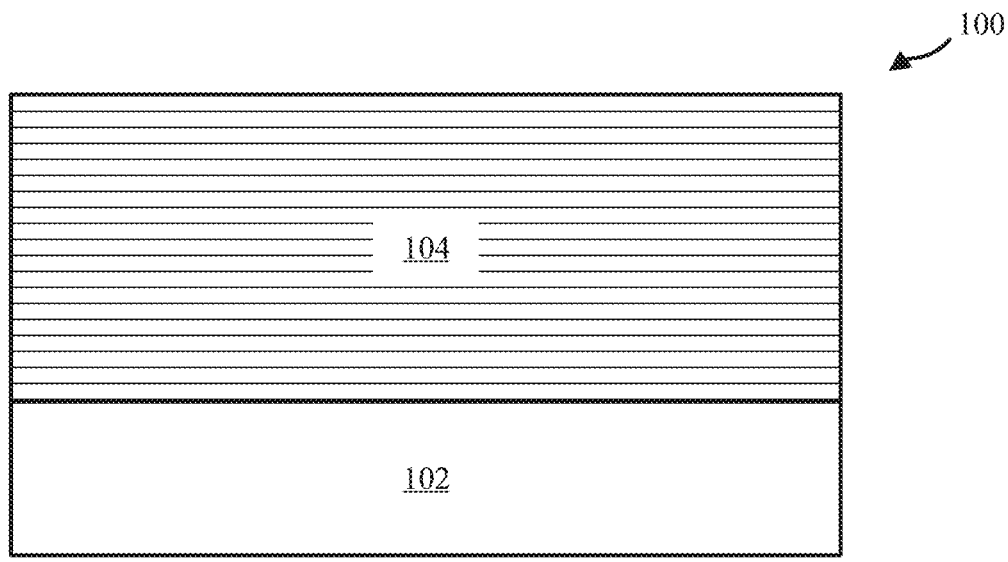
FIG. 1A is a cross-sectional view depicting a topological interconnect at an intermediate stage of the manufacturing process, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Aspects of the present disclosure relate generally to the electrical, electronic, and computer fields, and in particular to topological semi-metal interconnects and methods of manufacturing the same. While the present disclosure is not necessarily limited to such applications, various aspects of the disclosure may be appreciated through a discussion of various examples using this context.

Various embodiments of the present disclosure are described herein with reference to the related drawings. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

In semiconductor fabrication, after the semiconductor devices (e.g., transistors, capacitors, resistors, etc.) have been created, they are connected to each other to form the desired electrical circuits. This is done in a series of steps that are collectively referred to as back-end-of-line (BEOL) processing. BEOL processing involves creating various metal interconnects (e.g., wires and vias), isolated from each other by dielectric layers, to connect the semiconductor devices together. Historically, BEOL interconnects were made out of aluminum. However, most modern microprocessors use copper (Cu) as the wiring material of choice (along with newer, low-k dielectrics) due to its enhanced conductivity and the associated reduction in timing delays in the wiring.

As interconnect dimensions continue to shrink beyond the 7 nm node, large increases in line resistance significantly degrades the total circuit performance, despite the advancement in transistor technology. Specifically, the extendibility of Cu interconnects is questionable since Cu requires thick barrier layers & adhesion layers, reducing Cu volume and increasing resistance. In addition, the detrimental effect of grain-boundary scattering and surface-roughness scattering grows with decreasing Cu linewidth, resulting in polynomial increase in resistivity.

To combat this, alternative conductors have been researched. For example, other conventional metals, such as Co and Ru, have been under considerable investigations, but they also suffer from the increasing resistivity for the similar reasons as Cu. On the other hand, alternate materials—like topological insulators—show little/no resistivity size effect. They nevertheless show low carrier densities, making realistic integration unlikely.

Recognizing the need for a conductive material that can scale down to smaller nodes, and recognizing that currently researched materials may not outperform Cu, embodiments of the present disclosure include structures for topological interconnects based on bulk topological semi-metal materials, and method of manufacturing the same. As discovered by the inventors, the bulk topological semi-metal materials exhibit improved resistivity size effect compared to current interconnect materials, particularly at small (e.g., 5 nm and 3 nm) nodes. In some cases, the topological semi-metal materials exhibit positive resistivity size effects (e.g., as the nodes become smaller, the resistivity of the metal decreases).

In other words, the inventors, using material-specific quantum transport simulation, are the first to have discovered, and herein disclosed, that the resistance-area scaling of topological semi-metals are qualitatively different from conventional metals, such as Cu. In short, in Cu thin films with decreasing thickness, the resistance-area product rises above the bulk value in the presence of disorder. In contrast, in the prototypical topological semimetal CoSi, for example, the resistance-area product decreases with film thickness even in the presence of disorder. This unexpected property of topological semi-metals was not previously known to those of skill in the art. Additionally, the inventors have discovered that the semi-metal materials have sufficiently high carrier density at the Fermi level, which makes them practical for the proposed application. These findings are shown and discussed in more detail with respect to FIGS. 13-20 below.

Topological semi-metals refer to a new class of materials in which conduction and valence bands touch at discrete nodal points or along a loop in the first Brillouin zone near the Fermi energy. Such band-crossing points are robust in 3D materials with either broken inversion symmetry or broken time-reversal symmetry, namely, in 3D non-centrosymmetric or 3D magnetic materials. The band-crossing point locations may shift in the Brillouin zone, but they cannot be removed by perturbations in material parameters.

These band-crossing points are generally referred to as the Weyl nodes. One can define an integer-value topological invariant (called Chern number) for each Weyl node as the flux of its "Berry curvature," where Berry curvature is the momentum-space analogue of the magnetic field. The Weyl nodes thus correspond to the momentum-space magnetic monopoles, namely, the sources or sinks of the Berry curvature. Just as magnetic flux lines must form closed loops, Weyl nodes with opposite Chern numbers must appear in pairs in the Brillouin zone. Furthermore, they can only be removed by annihilation with each other.

Another defining attribute of the topological semi-metals is the presence of topological surface states connecting the two Weyl nodes in pairs, forming open Fermi arcs at the Fermi energy. The number of surface bands emanating from one Weyl node to the other is equal to the Chern number associated with the Weyl nodes. Again, perturbations in structural or material parameters cannot remove the Fermi arcs unless pairs of Weyl nodes annihilate each other, which implies that the topology of the material band structure must change for this to happen. Therefore, both the Weyl nodes and the Fermi arcs are said to be topologically protected.

There are many types of topological semi-metals. We roughly categorize them according to the dimensionality of the band crossings and band degeneracies at the nodes.

Those with 0D band crossings include Weyl semi-metals and multifold-fermion semi-metals. The former has a 2-fold band degeneracy, while the latter can have 3-, 4-, 6-, or 8-fold band degeneracies at the nodes. The non-magnetic, non-centrosymmetric Weyl semi-metals include the TaAs, TaP, NbAs, NbP family, (Mo,W)Te$_2$, LaAlGe, and TaIrTe$_4$. The magnetic Weyl semi-metals include: Co$_3$Sn$_2$S$_2$, Mn$_{3+x}$Sn$_{1-x}$, EuCd$_2$As$_2$, RAlGe (where R is a rare earth metal), and PrAlGe. The multifold-fermion semi-metals include CoSi, RhSi, CoGe, RhGe, and AlPt. The double-Weyl fermion may also be used in some embodiments.

Weyl nodes and Fermi arcs also exist in non-magnetic chiral crystals with relevant spin-orbit coupling. Candidates of these so-called Kramers-Weyl fermion topological semi-metals include: Ag$_3$BO$_3$ (SG-156), T1Te$_2$O$_6$ (SG-150), Ag$_2$Se (SG-19), etc., where SG=space group.

Topological semi-metals with 1D band crossings are called topological nodal-line semi-metals. These semi-metals include: Co$_2$MnGa, and XY$_4$ crystals (X=Ir, Ta, Re; Y=F, Cl, Br, I) with lattices formed of octahedra, similar to IrF$_4$.

Besides the topological semi-metals described above, there is yet another distinct type of topological conducting materials—the triple-point topological metals. They feature topologically protected Weyl nodes of three bands, two of which are degenerate along a high-symmetry direction in the Brillouin zone. They are distinct from the topological semi-metals in that the band gap between the conduction and the valence bands closes along this high-symmetry line. Examples of triple-point topological metals include WC, MoC, MoP, MoN, ZrTe, etc.

Unlike topological insulators, topological semi-metals have a much higher carrier density at the Fermi level and also high carrier mobility, enabling high current-carrying capacity. As the dimension of the topological semi-metal scales below ~10 nm, carrier transport via the Fermi-arc states becomes pronounced, potentially dominating over the bulk-state transport. Depending on the types of impurity scattering and the type of topological semi-metals, significant surface-state transport may persist up to ~100 μm.

Electron transmission via the Fermi-arc states are robust against defects and impurities if the film thickness exceeds the material-dependent threshold value, e.g., ~2.5 nm in CoSi, which ensures high mobility for Fermi-arc surface electrons, even at very small thicknesses. Additionally, the scattering of bulk electrons is generally suppressed because the multiple bands that cross the Weyl nodes are orthogonal to each other, which ensures high mobility for bulk-state electrons near the Weyl nodes. These considerations mean that topological semi-metals with (1) a high Chern number, (2) many pairs of Weyl nodes, and (3) very few or no topologically trivial bulk bands near the Fermi level are preferred materials for scaled BEOL interconnect applications.

As an example, the Weyl semi-metal NbAs has shown a lower resistivity (1-5 μΩ-cm) at the sub-micron scale than its bulk resistivity (~35 μΩ-cm), enabling potential >50% resistance-capacitance product (RC) reductions at 5 nm node dimensions. Extremely low resistivity is also observed in topological metal MoP (~9 nΩ-cm at 2 K and 8.2 μΩ-cm at 300 K). As a comparison, Cu bulk resistivity is ~2 μΩ-cm, increasing to ~15 μΩ-cm at the 15-18 nm scale.

Embodiments of the present disclosure include process flows for both single damascene and via-last integration schemes based on blanket deposition of a topological semi-metal. As discussed herein, embodiments of topological semi-metals and topological metals include (but are not limited to) Weyl semi-metals NbAs, TaAs, NbP, TaP, (Mo, W)Te$_2$ etc.; multi-fold fermion systems RhSi, CoSi etc., magnetic Weyl semi-metals Co$_3$Sn$_2$S$_2$, Mn$_{3+x}$Sn$_{1-x}$, PrAlGe etc.; Kramers-Weyl fermions Ag$_2$Se etc., and triple-point topological metals MoP, WC, etc.

Embodiments of the present disclosure include methods and structures that utilize topological semi-metals as the material of BEOL interconnects (e.g., wires and vias) between individual semiconductor devices (e.g., transistors, capacitors, resistors, etc.). A topological semi-metal is deposited as a thin film. The topological semi-metal is then subtractively patterned to form lines and/or vias. This may be done using any suitable fabrication process (e.g., an etching process). Regions of exposed, oxidized topological semi-metal and/or topological metals are then removed by etching.

In some embodiments, after removing the oxidized topological semi-metal, thin protective material may be deposited. Embodiments of said protective layer may include, for example, a dielectric (SiCN, SiN, SiC), a metal (ALD=TaN, TiN), graphene, etc. A dielectric material is then deposited on top of interconnect lines and vias with the protective layer. The dielectric material is chemical-mechanical polished (CMP) to expose the top surface of the lines and/or vias. Once the top surface of the lines and/or vias is exposed, a hermetic dielectric cap layer is deposited.

In some embodiments, the topological semi-metal includes pairs of bulk band-crossings (called Weyl nodes) with non-zero topological invariant Chern numbers (C) with opposite electron chiralities ±C defined for each Weyl node. Additionally, the topological semi-metal has robust gapless surface bands (called Fermi arcs) emanating from the Weyl nodes; the number of Fermi arcs equals the Chern number of each associated Weyl node. In some embodiments, the Fermi Energy of the topological semi-metal lies within ~25 meV from the energy of its Weyl nodes.

In some embodiments, the topological semi-metal exhibits suppressed bulk carrier scattering near the Weyl nodes due to band orthogonality and high conductivity with significant contributions from the surface Fermi arc states, giving rise to resistivity reduction with decreasing dimensions. The topological semi-metal may have large spin-orbit coupling, yielding bulk bands and Fermi arcs with nontrivial spin textures.

Representative embodiments of a topological semi-metal include Weyl semi-metals NbAs, TaAs, NbP, TaP, (Mo,W)

Te$_2$; Dirac semi-metals CdAs; multifold fermions CoSi, RhSi, magnetic Weyl semi-metals Co$_3$Sn$_2$S$_2$, Mn$_{3+x}$Sn$_{1-x}$, Kramers-Weyl fermions Ag$_3$BO$_3$, Ag$_2$Se. Representative embodiments of a topological metal include triple-point topological metals MoP, WC, etc. The thickness of the topological semi-metals may range from 2-100 nm, with a preferred range of thickness between 3-10 nm in some embodiments.

Turning now to the figures, FIGS. 1A-6C depict the process of creating a single damascene using topological semi-metals at various stages of the manufacturing process, in accordance with embodiments of the present disclosure. In particular, FIG. 1A is a cross-sectional view depicting a topological interconnect 100 (single damascene) at an intermediate stage of the manufacturing process. FIG. 1A shows the topological interconnect 100 after the initial formation of a topological semi-metal 104 on top of a substrate or dielectric 102.

The topological semi-metal 104 may be any suitable topological semi-metal, as discussed herein. For example, the topological semi-metal 104 may be NbAs. Additionally, forming the topological semi-metal 104 on the substrate or dielectric 102 may be done using any suitable fabrication process for depositing a semi-metal on a semi-conductor. For example, blanket deposition techniques (e.g., PVD or CVD) may be used to deposit NbAs on the substrate or dielectric 102.

Figure 1B:
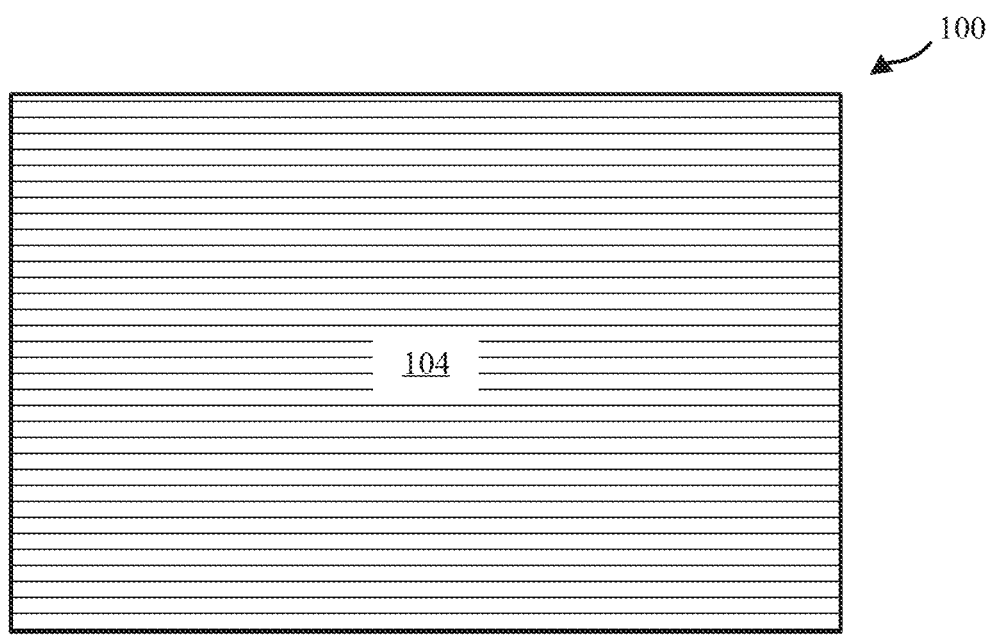
FIG. 1B is a plan view depicting the topological interconnect of FIG. 1A, in accordance with embodiments of the present disclosure.

Referring now to FIG. 1B, shown is a plan (top down) view depicting the topological interconnect of FIG. 1A, in accordance with embodiments of the present disclosure. As shown in FIG. 1B, the topological semi-metal 104 is deposited over an area of the substrate or dielectric 102 such that there are initially no gaps in the topological semi-metal 104 where the damascene (e.g., topological interconnect 100) is being formed.

Figure 2A:
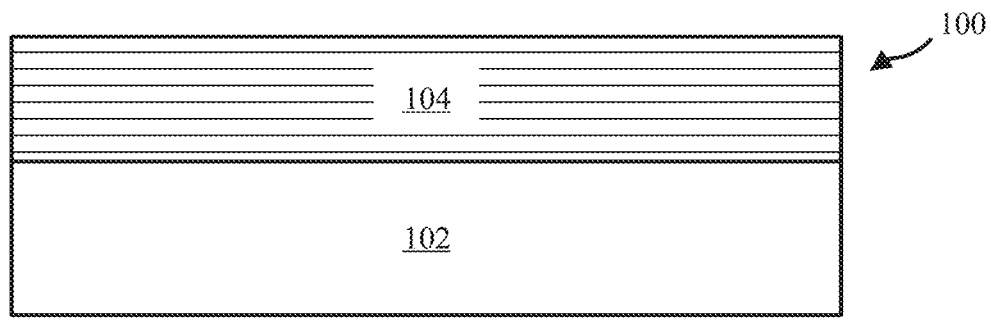
FIG. 2A is a cross-sectional view of the topological interconnect of FIG. 1A after additional fabrication processes, in accordance with embodiments of the present disclosure.
Figure 2B:
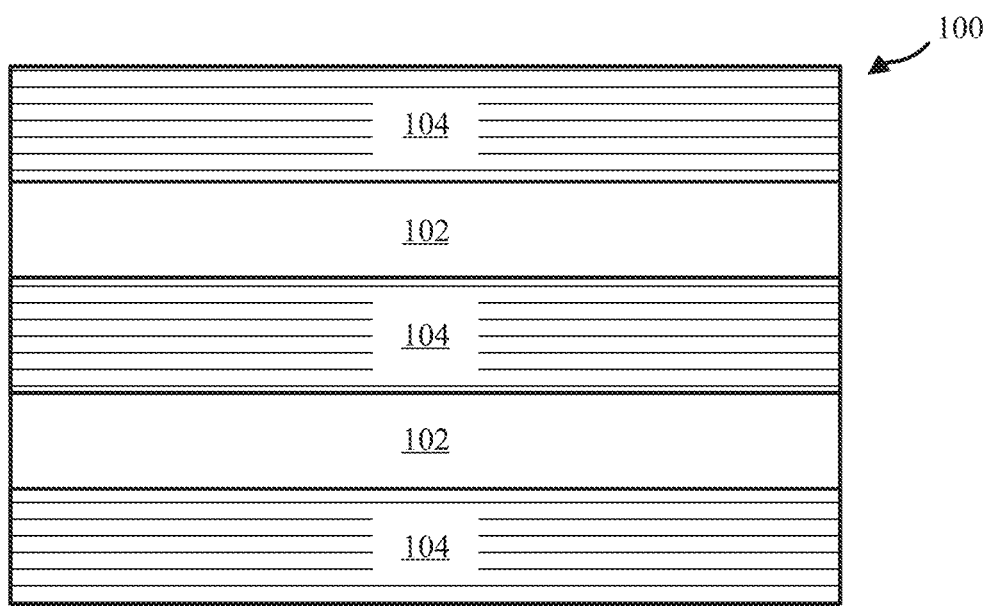
FIG. 2B is a plan view depicting the topological interconnect of FIG. 2A, in accordance with embodiments of the present disclosure.
Figure 2C:
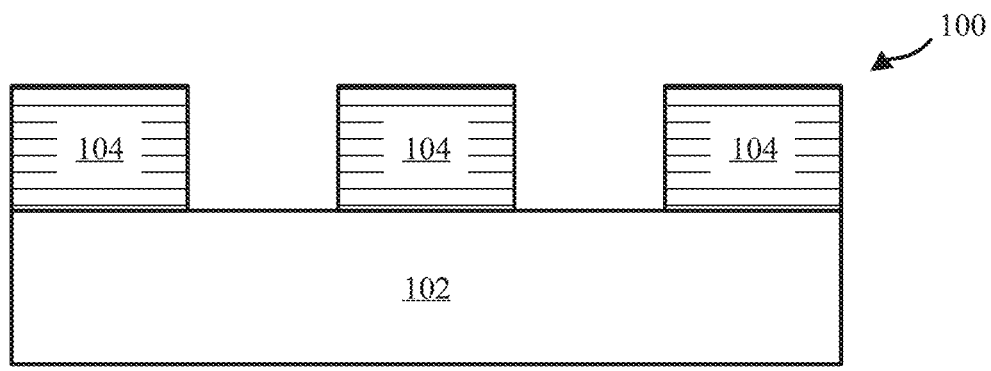
FIG. 2C is a side view of the topological interconnect of FIG. 2A, in accordance with embodiments of the present disclosure.

Referring now to FIGS. 2A-2C, subtractive line patterning is performed to create one or more lines of topological semi-metal 104 with gaps between them. The subtractive line patterning may utilize any suitable fabrication process for removing part of the topological semi-metal 104. For example, etching may be used to remove portions of the topological semi-metal 104. The etching may remove portions in the gaps all the way down to the substrate or dielectric 102. This is best shown in the plan view of FIG. 2B, which shows the gaps of substrate or dielectric 102 between the topological semi-metal 104, and FIG. 2C, which shows a side view of the topological interconnect 100 (e.g., looking at FIG. 2A from the right).

Figure 3A:
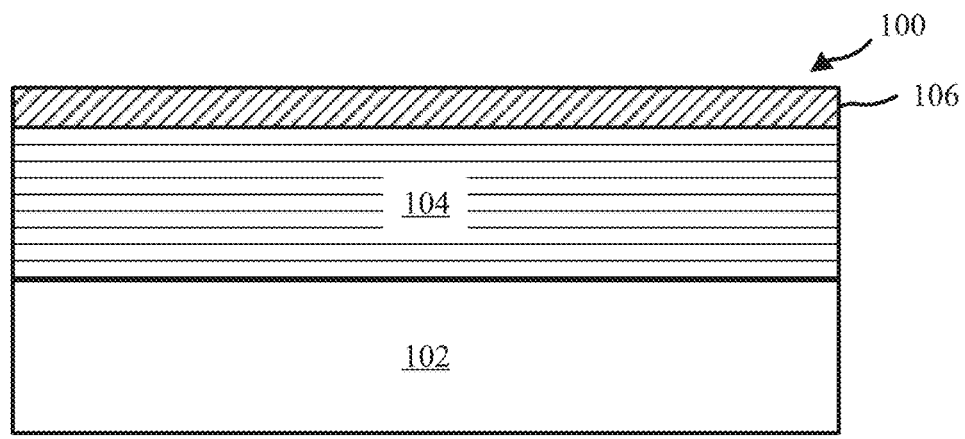
FIG. 3A is a cross-sectional view of the topological interconnect of FIG. 2A after additional fabrication processes, in accordance with embodiments of the present disclosure.
Figure 3B:
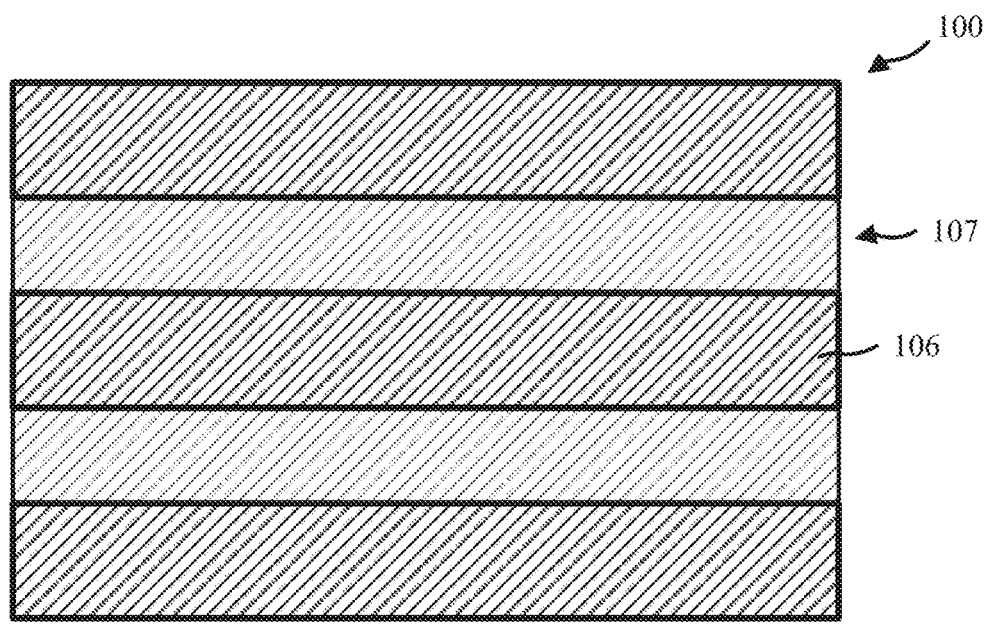
FIG. 3B is a plan view depicting the topological interconnect of FIG. 3A, in accordance with embodiments of the present disclosure.
Figure 3C:
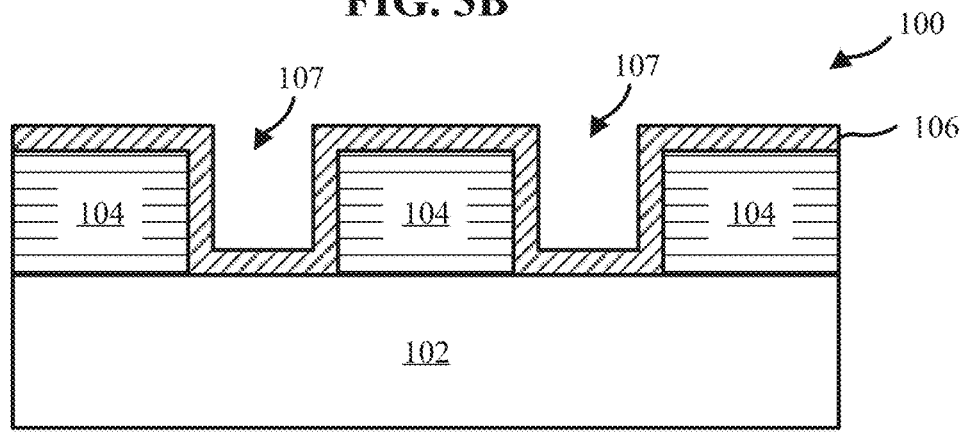
FIG. 3C is a side view of the topological interconnect of FIG. 3A, in accordance with embodiments of the present disclosure.

Referring now to FIGS. 3A-3C, oxidized portions of the topological semi-metal 104 are removed, and a protective layer 106 is formed on the tops and sides of the topological semi-metal 104, as well as on top of the substrate or dielectric 102 between the topological semi-metal 104 lines. The protective layer 106 may be any suitable layer that protects the topological semi-metal 104 from oxidation. For example, the protective layer 106 may be a dielectric (e.g., SiCN, SiN, SiC) or metal (e.g., ALD=TaN, TiN). The oxidized layer of the topological semi-metal 104 can be removed using any suitable fabrication process (e.g., a CMP polishing process). Similarly, the protective layer 106 may be formed on the topological semi-metal 104 and the substrate/dielectric using any suitable fabrication process. For example, a proactive metal layer may be formed using a deposition technique.

As shown in FIGS. 3B and 3C, the protective layer blankets both the topological semi-metal 104 and the top of the previously exposed parts of the substrate or dielectric 102. However, the protective layer is sufficiently thin that gaps 107 between the individual layers of the topological semi-metal 104 remain.

Figure 4A:
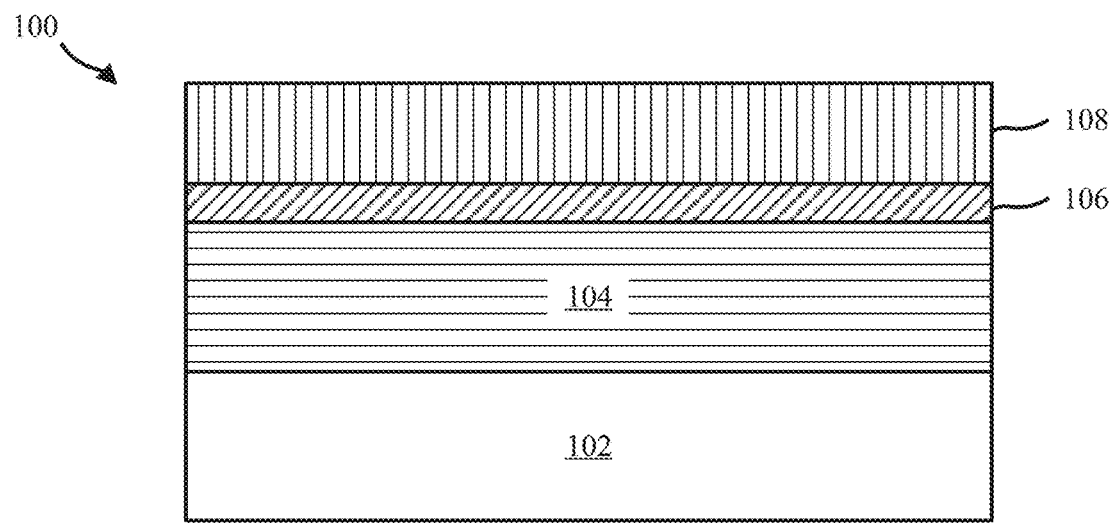
FIG. 4A is a cross-sectional view of the topological interconnect of FIG. 3A after additional fabrication processes, in accordance with embodiments of the present disclosure.
Figure 4B:
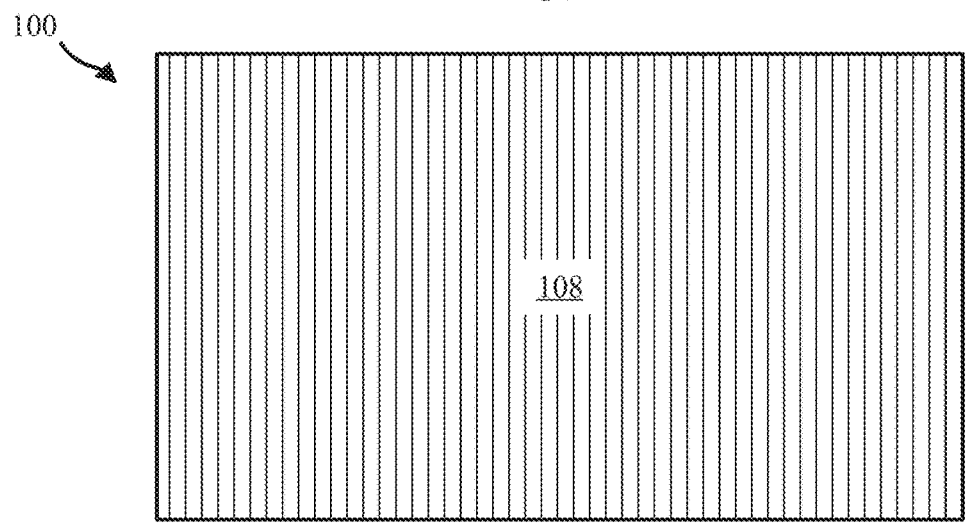
FIG. 4B is a plan view depicting the topological interconnect of FIG. 4A, in accordance with embodiments of the present disclosure.
Figure 4C:
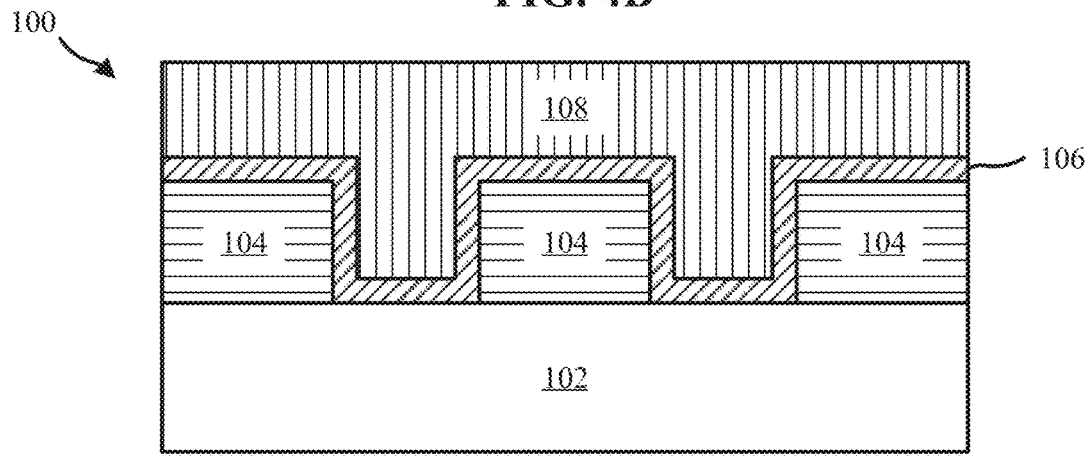
FIG. 4C is a side view of the topological interconnect of FIG. 4A, in accordance with embodiments of the present disclosure.

Referring now to FIGS. 4A-4C, a dielectric layer 108 is formed on top of the protective layer 106. The dielectric layer 108 may be formed using any suitable dielectric material and fabrication technique. As shown in FIG. 4C, the dielectric layer 108 fills in the gaps 107 between the topological semi-metal 104 lines. Additionally, the dielectric layer 108 is formed on top of the protective layer 106.

Figure 5A:
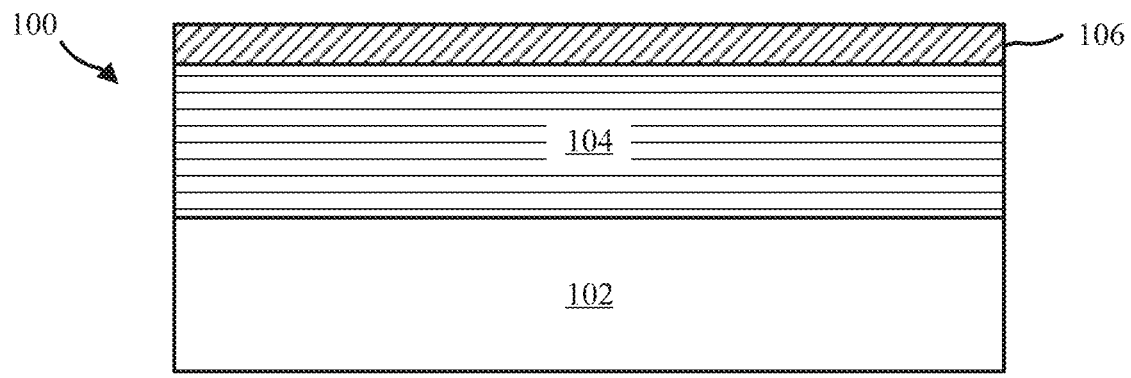
FIG. 5A is a cross-sectional view of the topological interconnect of FIG. 4A after additional fabrication processes, in accordance with embodiments of the present disclosure.
Figure 5B:
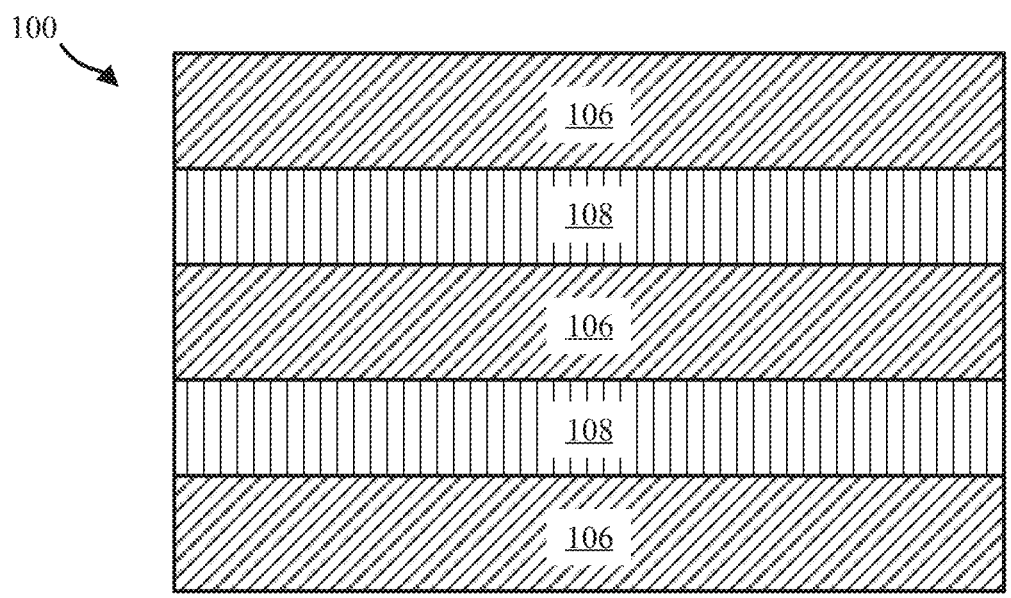
FIG. 5B is a plan view depicting the topological interconnect of FIG. 5A, in accordance with embodiments of the present disclosure.
Figure 5C:
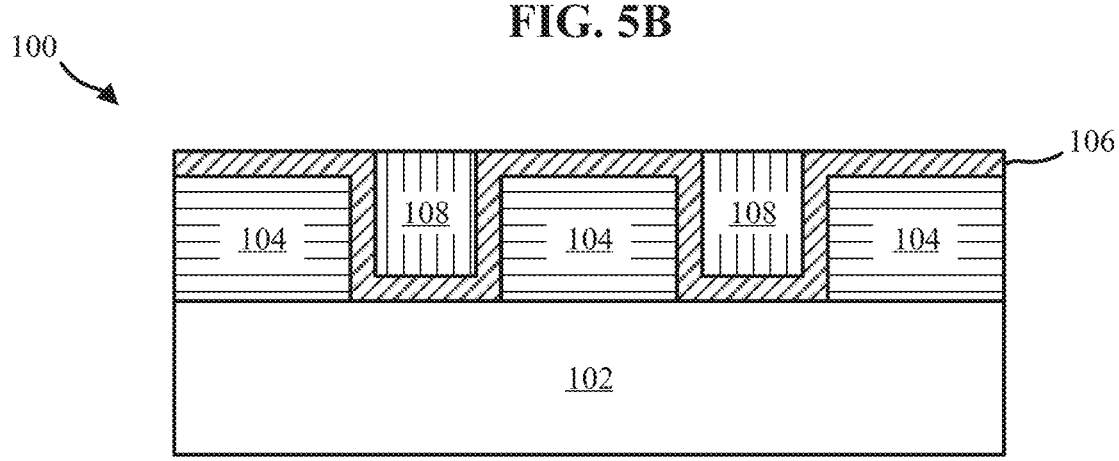
FIG. 5C is a side view of the topological interconnect of FIG. 5A, in accordance with embodiments of the present disclosure.

Referring now to FIGS. 5A-5C, the dielectric layer 108 undergoes a polishing process (e.g., a dielectric CMP process). The dielectric layer 108 may be removed such that it only fills the gaps 107 between the topological semi-metal 104 lines. For example, as shown in FIGS. 5B and 5C, the dielectric layer 108 is removed such that the top parts of the dielectric layer 108 is flush with the highest parts of the protective layer 106 (i.e., the parts that are on top of the topological semi-metal 104 and not the substrate or dielectric 102).

Figure 6A:
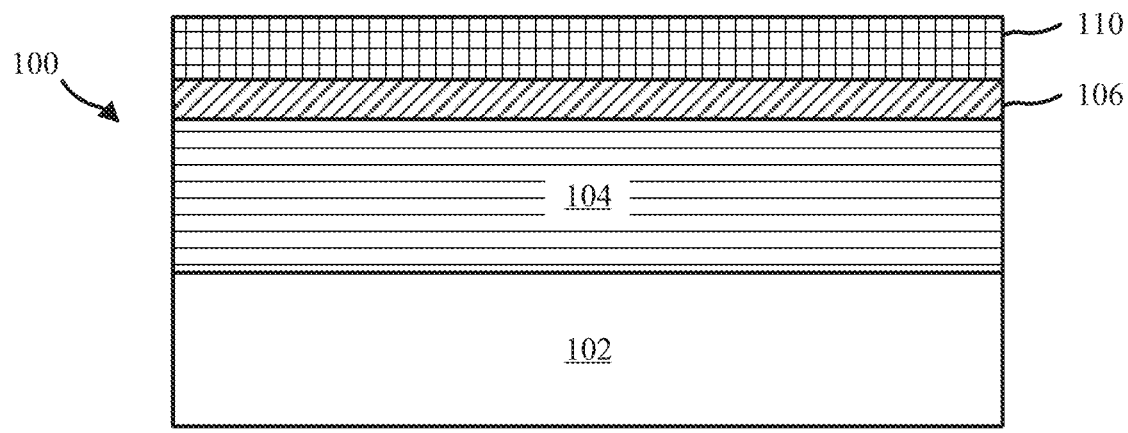
FIG. 6A is a cross-sectional view of the topological interconnect of FIG. 5A after additional fabrication processes, in accordance with embodiments of the present disclosure.
Figure 6B:
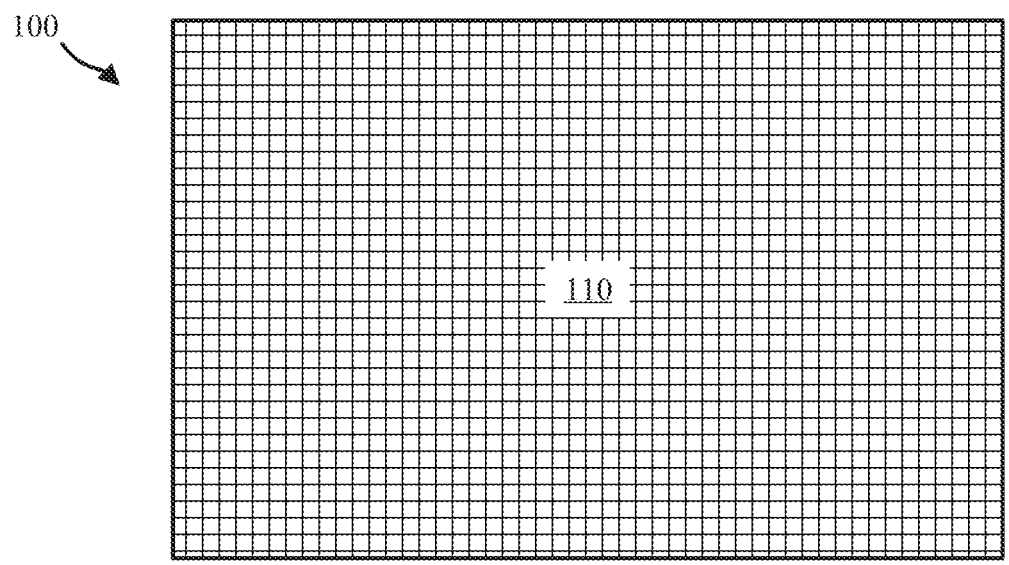
FIG. 6B is a plan view depicting the topological interconnect of FIG. 6A, in accordance with embodiments of the present disclosure.
Figure 6C:
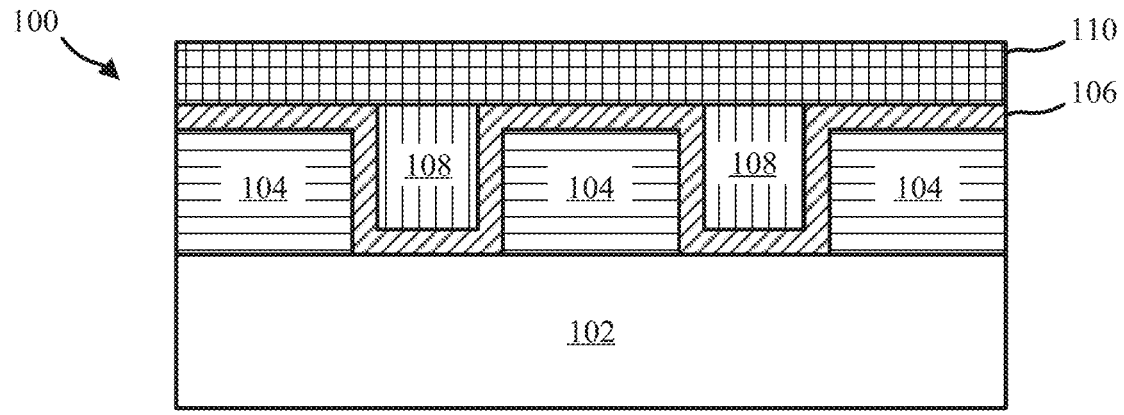
FIG. 6C is a side view of the topological interconnect of FIG. 6A, in accordance with embodiments of the present disclosure.

Referring now to FIGS. 6A-6C, a dielectric cap 110 is formed on top of the exposed parts of the protective layer 106 and the dielectric layer 108. The dielectric cap 110 may be formed using any suitable fabrication process. For example, forming the dielectric cap 110 may include depositing a dielectric (e.g., low-k) material on top of the protective layer 106 and the dielectric layer 108.

Figure 7A:
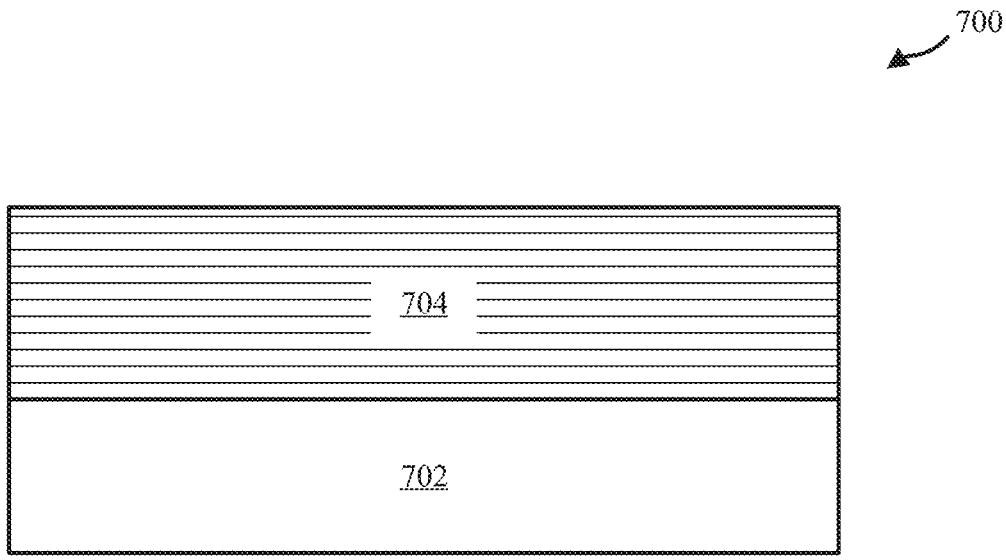
FIG. 7A is a cross-sectional view depicting a topological interconnect at an intermediate stage of the manufacturing process, in accordance with embodiments of the present disclosure.

FIGS. 7A-12B depict the process of creating vias using topological semi-metals at various stages of the manufacturing process, in accordance with embodiments of the present disclosure. In particular, FIG. 7A is a cross-sectional view depicting a topological interconnect 700 (comprising a set of vias) at an intermediate stage of the manufacturing process. FIG. 7A shows the topological interconnect 700 after the initial formation of a topological semi-metal 704 on top of a substrate or dielectric 702.

The topological semi-metal 704 may be any suitable topological semi-metal, as discussed herein. For example, the topological semi-metal 704 may be NbAs. Additionally, forming the topological semi-metal 704 on the substrate or dielectric 702 may be done using any suitable fabrication process for depositing a semi-metal on a semi-conductor. For example, blanket deposition techniques (e.g., PVD or CVD) may be used to deposit NbAs on the substrate or dielectric 702.

Figure 7B:
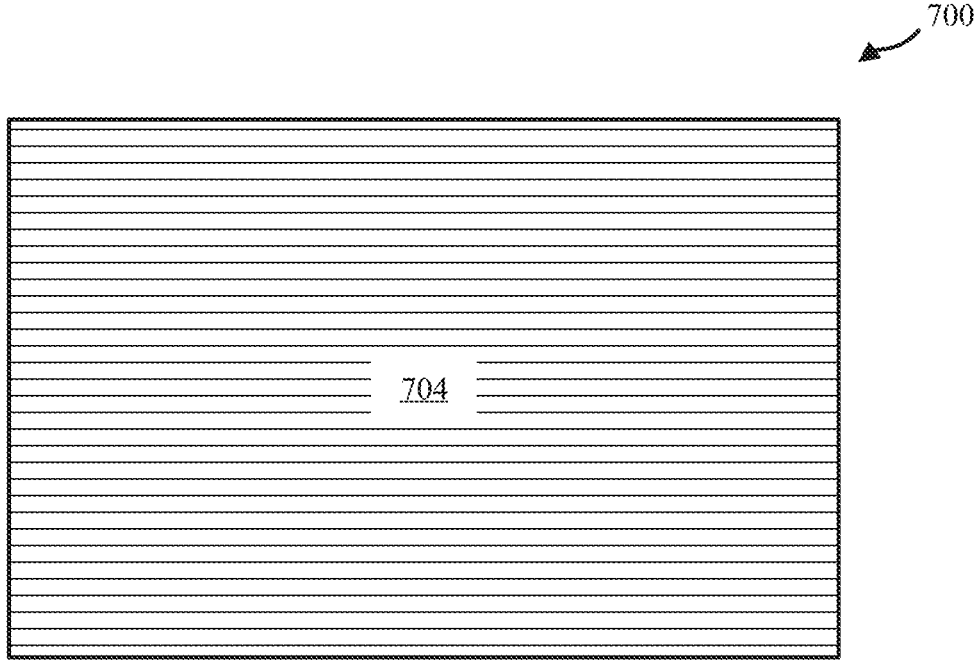
FIG. 7B is a plan view depicting the topological interconnect of FIG. 7A, in accordance with embodiments of the present disclosure.

Referring now to FIG. 7B, shown is a plan (top down) view depicting the topological interconnect of FIG. 7A, in accordance with embodiments of the present disclosure. As shown in FIG. 7B, the topological semi-metal 704 is deposited over an area of the substrate or dielectric 702 such that there are initially no gaps in the topological semi-metal 704 where the vias (e.g., topological interconnect 700) are being formed.

Figure 8A:
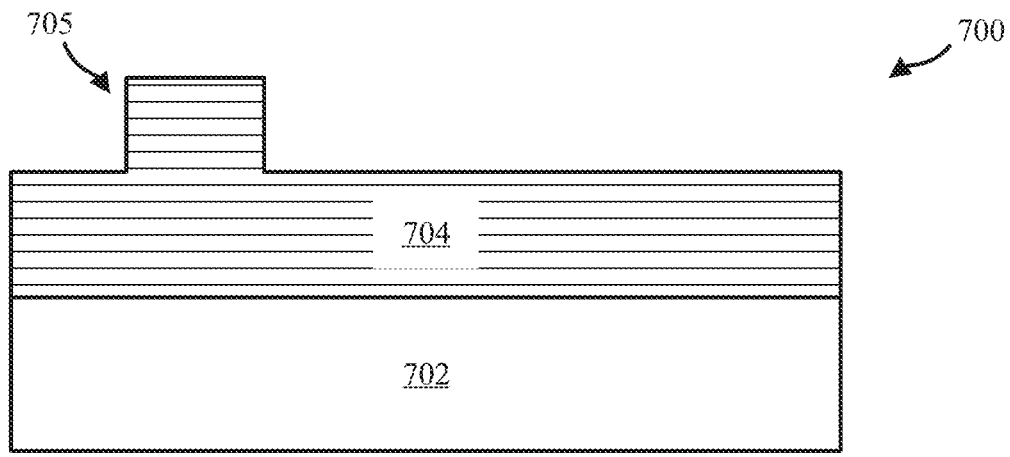
FIG. 8A is a cross-sectional view of the topological interconnect of FIG. 7A after additional fabrication processes, in accordance with embodiments of the present disclosure.
Figure 8B:
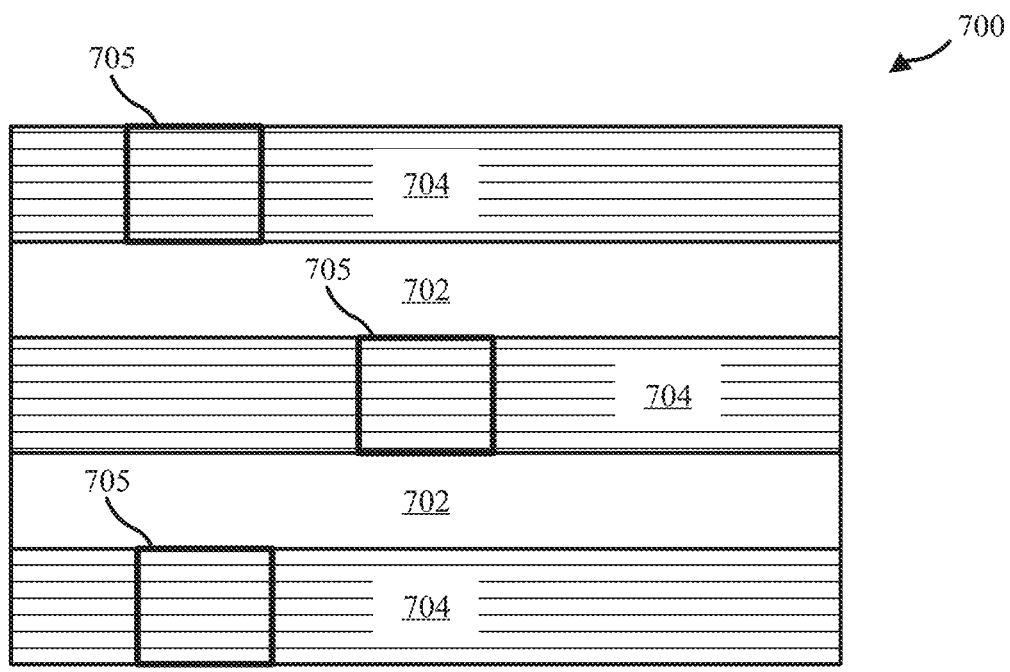
FIG. 8B is a plan view depicting the topological interconnect of FIG. 8A, in accordance with embodiments of the present disclosure.

Referring now to FIGS. 8A-8B, subtractive line patterning is performed to create one or more lines of topological semi-metal 704 with gaps between them. The subtractive line patterning may utilize any suitable fabrication process for removing part of the topological semi-metal 704. For example, etching may be used to remove portions of the topological semi-metal 704. The etching may remove portions in the gaps all the way down to the substrate or dielectric 702. This is best shown in the plan view of FIG. 8B, which shows the gaps of substrate or dielectric 702 between the topological semi-metal 704.

Additionally, via patterning is performed to create multiple vias 705 (e.g., extrusions in the topological semi-metal 704). Any suitable fabrication process for via patterning may be performed. For example, masks may be used during the etching process to prevent etching (or substantially etching) topological semi-metal 704 where the vias 705 are to be formed.

Figure 9A:
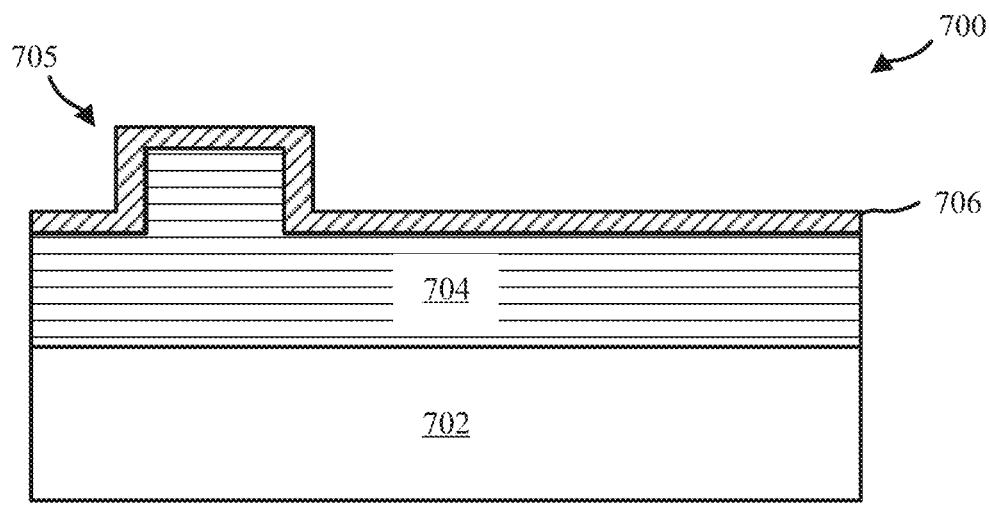
FIG. 9A is a cross-sectional view of the topological interconnect of FIG. 8A after additional fabrication processes, in accordance with embodiments of the present disclosure.
Figure 9B:
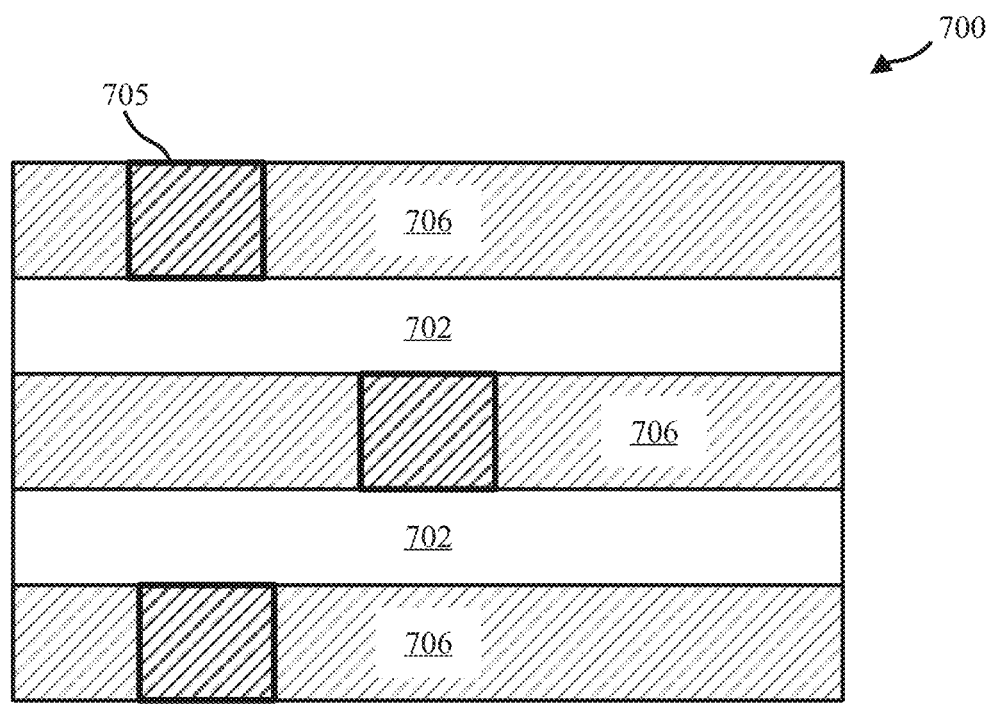
FIG. 9B is a plan view depicting the topological interconnect of FIG. 9A, in accordance with embodiments of the present disclosure.

Referring now to FIGS. 9A-9B, oxidized portions of the topological semi-metal 704 are removed, and a protective layer 706 is formed on the tops and sides of the topological semi-metal 704. In some embodiments (not shown), the protective layer 706 may also be formed on top of the substrate or dielectric 702 between the topological semi-metal 704 lines. The protective layer 706 may be any suitable layer that protects the topological semi-metal 704 from oxidation. For example, the protective layer 706 may be a dielectric (e.g., SiCN, SiN, SiC) or metal (e.g., ALD=TaN, TiN). The oxidized layer of the topological semi-metal 704 can be removed using any suitable fabrication process (e.g., a CMP polishing process). Similarly, the protective layer 706 may be formed on the topological semi-metal 704 and the substrate/dielectric using any suitable fabrication process. For example, a proactive metal layer may be formed using a deposition technique.

As shown in FIG. 9B, the protective layer 706 may only be deposited on top of the topological semi-metal 704. The protective layer 706 may be deposited on top of the entire topological semi-metal 704, not just on top of the vias 705. Additionally, the protective layer 706 may be deposited on the sides of the vias 705, as shown in FIG. 9A. In some embodiments, the protective layer 706 is also deposited on top of the previously exposed parts of the substrate or dielectric 702. However, the protective layer is sufficiently thin that gaps between the individual layers of the topological semi-metal 704 may remain.

Figure 10A:
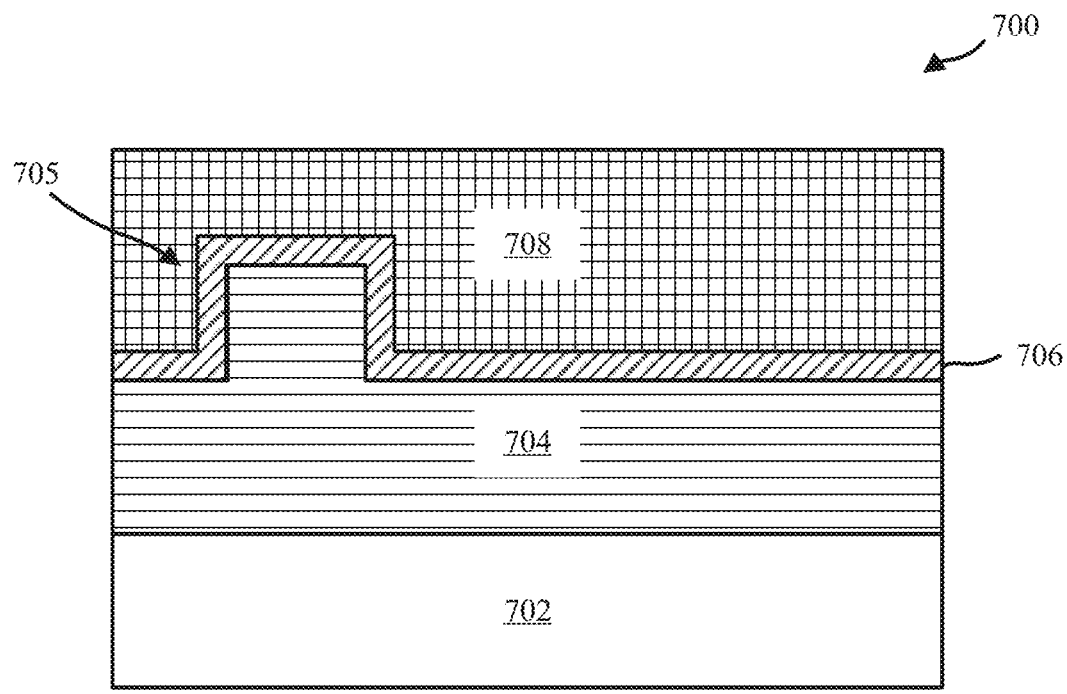
FIG. 10A is a cross-sectional view of the topological interconnect of FIG. 9A after additional fabrication processes, in accordance with embodiments of the present disclosure.
Figure 10B:
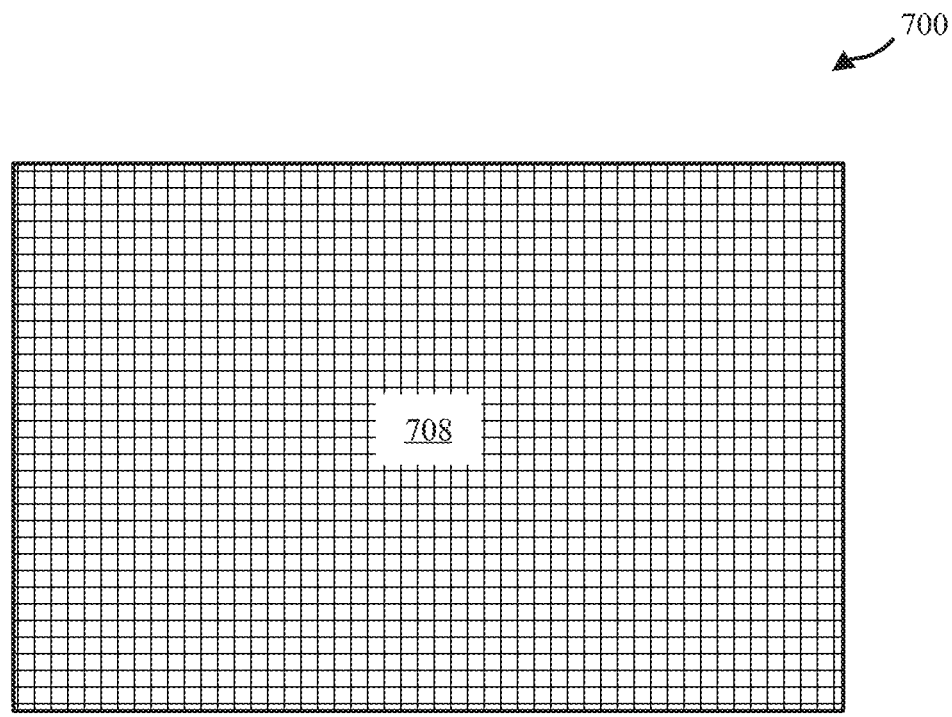
FIG. 10B is a plan view depicting the topological interconnect of FIG. 10A, in accordance with embodiments of the present disclosure.

Referring now to FIGS. 10A-10B, a dielectric layer 708 is formed on top of the protective layer 706. The dielectric layer 708 may be formed using any suitable dielectric material and fabrication technique. As shown in FIG. 10B, the dielectric layer 708 fills in the gaps between the topological semi-metal 704 lines. Additionally, the dielectric layer 708 is formed on top of the vias 705.

Figure 11A:
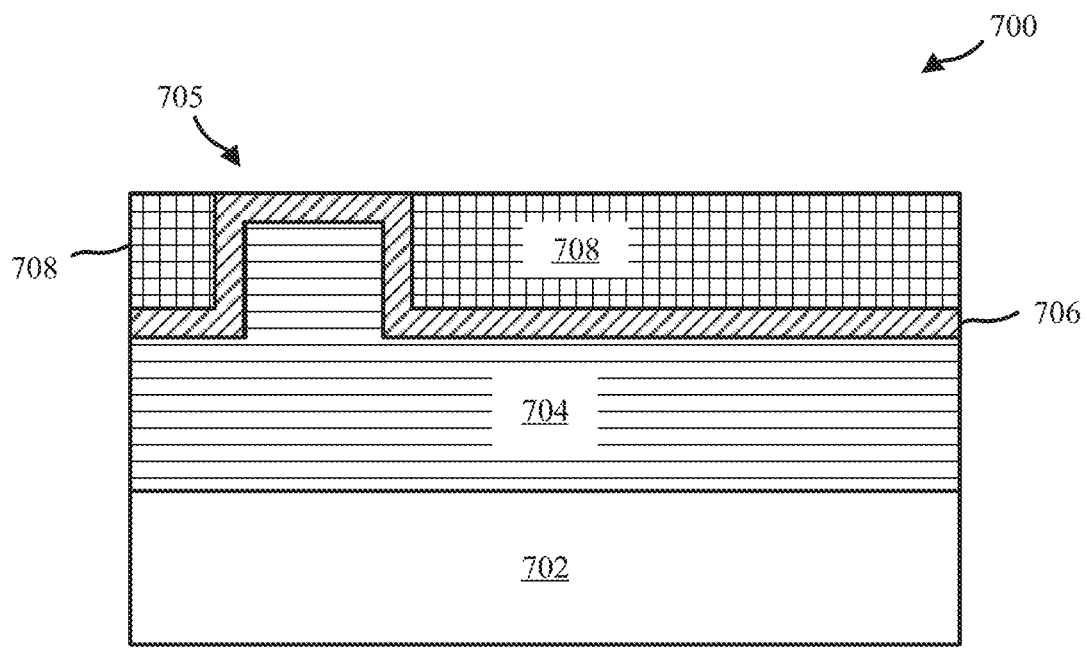
FIG. 11A is a cross-sectional view of the topological interconnect of FIG. 10A after additional fabrication processes, in accordance with embodiments of the present disclosure.
Figure 11B:
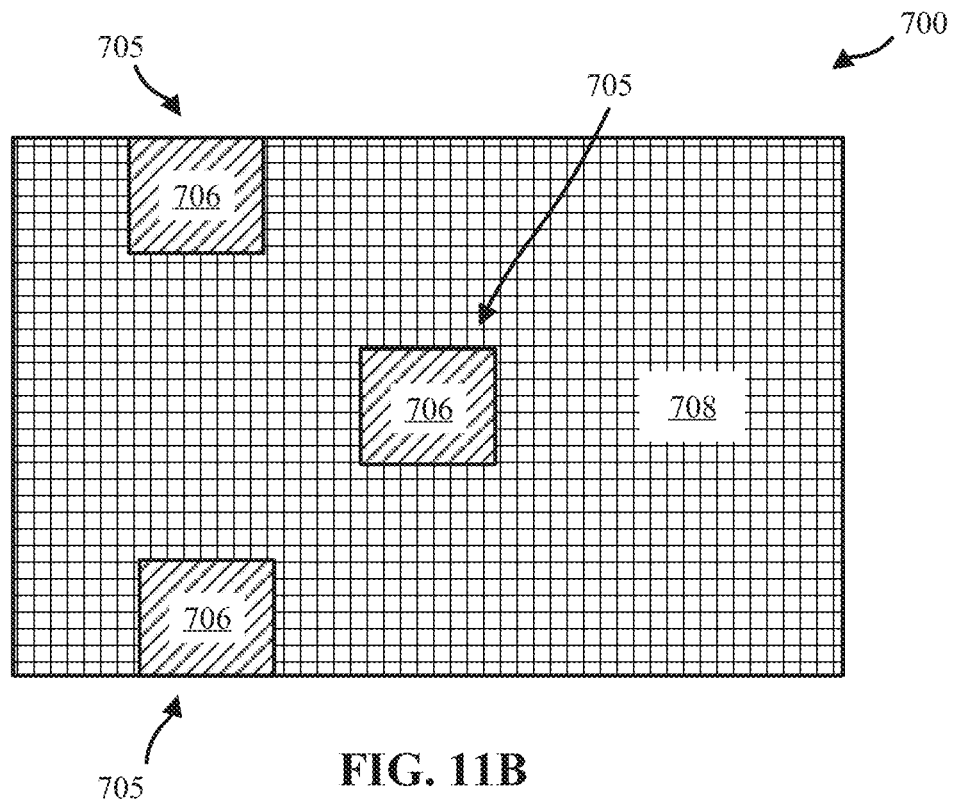
FIG. 11B is a plan view depicting the topological interconnect of FIG. 11A, in accordance with embodiments of the present disclosure.

Referring now to FIGS. 11A-11B, the dielectric layer 708 undergoes a polishing process (e.g., a dielectric CMP process). The dielectric layer 708 may be removed such that it fills the gaps between the vias 705. For example, as shown in FIG. 11B, the dielectric layer 708 is removed such that the top parts of the dielectric layer 708 is flush with the highest parts of the protective layer 706 (i.e., the parts that are on top of the vias 705 and not the rest of the topological semi-metal 704). This results in the protective layer 706 on top of the vias 705 being exposed.

Figure 12A:
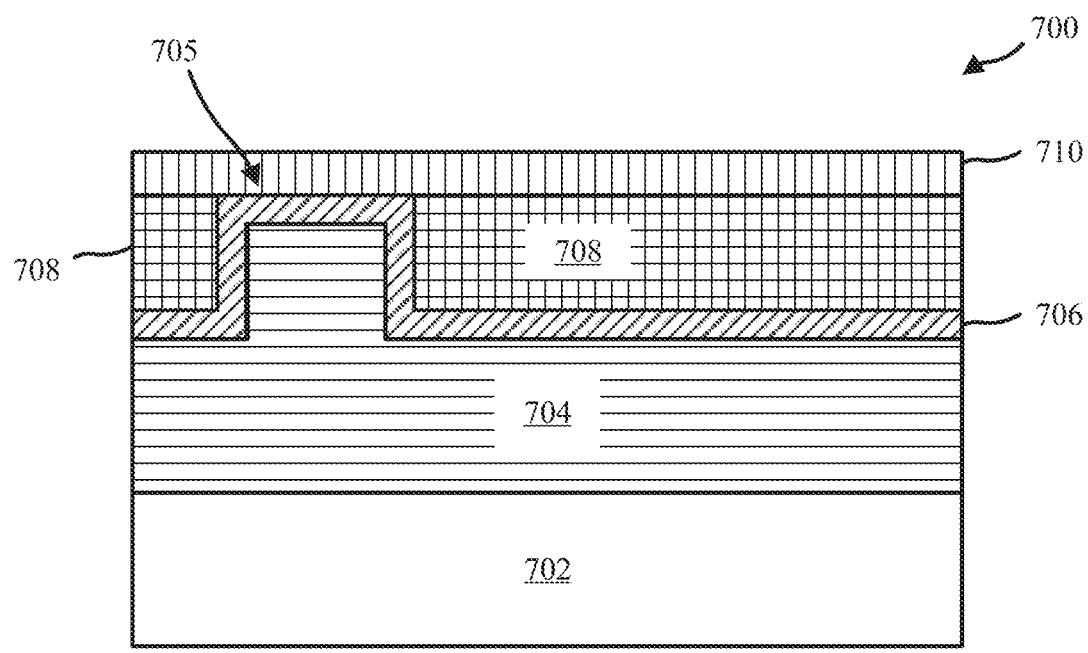
FIG. 12A is a cross-sectional view of the topological interconnect of FIG. 11A after additional fabrication processes, in accordance with embodiments of the present disclosure.
Figure 12B:
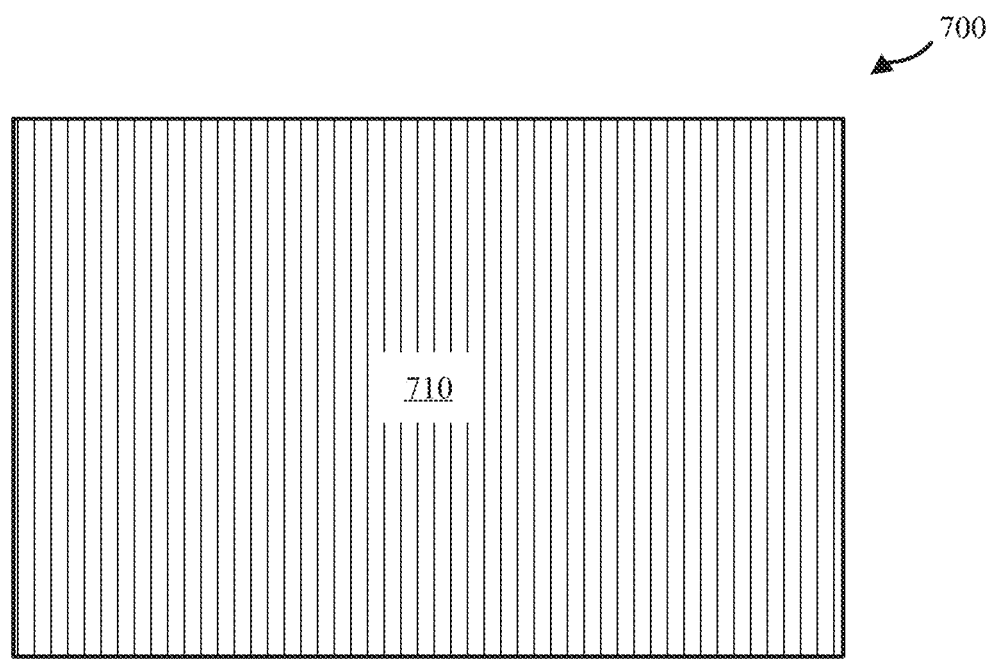
FIG. 12B is a plan view depicting the topological interconnect of FIG. 12A, in accordance with embodiments of the present disclosure.

Referring now to FIGS. 12A-12B, a dielectric cap 710 is formed on top of the exposed parts of the protective layer 706 and the dielectric layer 708. The dielectric cap 710 may be formed using any suitable fabrication process. For example, forming the dielectric cap 710 may include depositing a dielectric (e.g., low-k) material on top of the protective layer 706 and the dielectric layer 708.

Figure 13A:
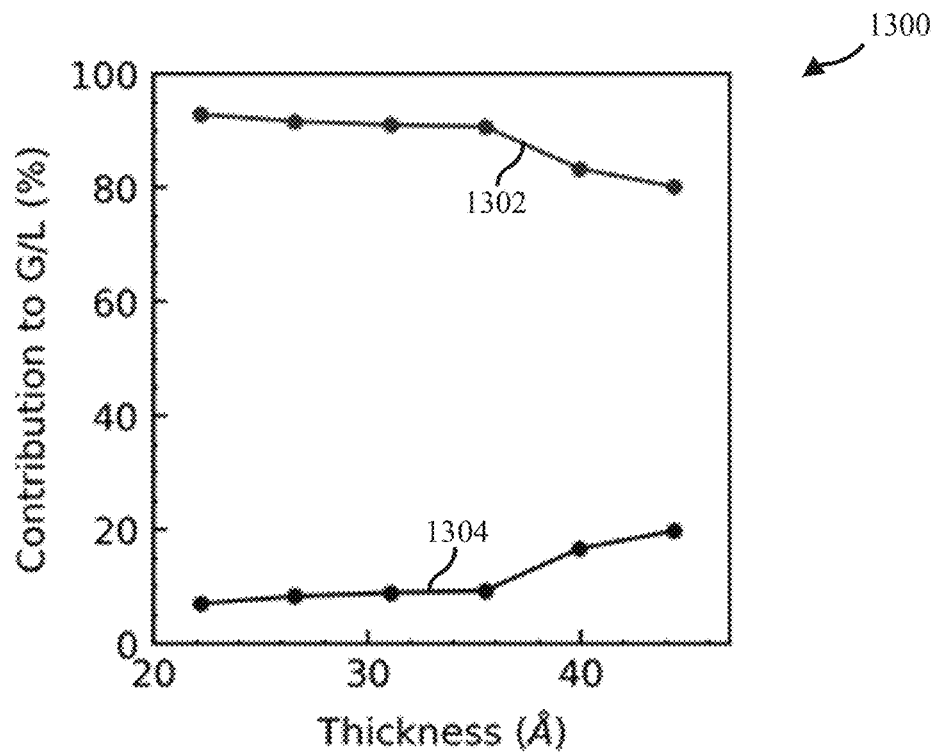
FIG. 13A is a graph showing the surface state contribution and bulk state contribution to total conductance of CoSi at various line thicknesses, in accordance with embodiments of the present disclosure.

Referring now to FIG. 13A, shown is a graph 1300 showing the surface state contribution 1302 and the bulk state contribution 1304 to total conductance of CoSi at various line thicknesses, in accordance with embodiments of the present disclosure. In particular, the surface state contribution 1302 and bulk state contribution 1304 shown in FIG. 13A are normalized such that the combination of the two contributes add up to 100% of the total conductance per unit length (G/L).

As shown in FIG. 13A, for CoSi slabs or films with a thickness between 20 and 45 atomic-layer thickness (Å), the surface state is responsible for the vast majority of the of the conductance of the CoSi slab. Additionally, as the slab thickness decreases, the contribution of the surface state to the total conductance increases. For example, at a slab thickness of 40 Å, the surface state is responsible for slightly over 80% of the total conductance. As the slab thickness decreases to 22 Å, this contribution increases to greater than 90% of the total conductance.

Figure 13B:
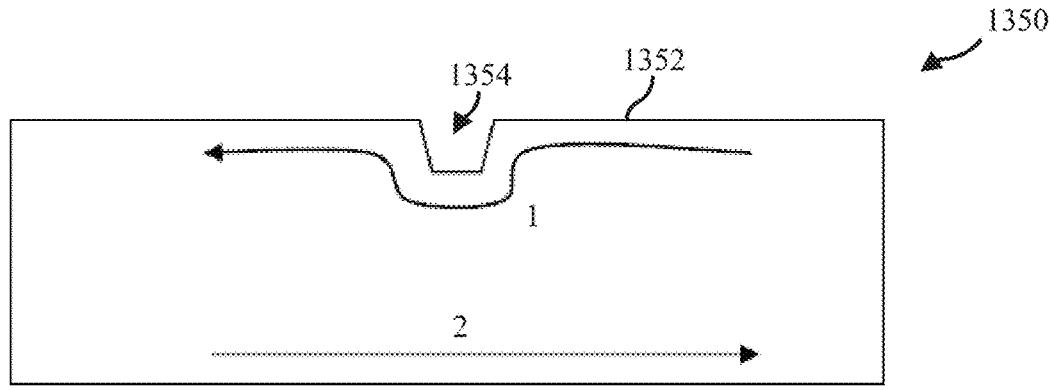
FIG. 13B is a diagram illustrating carrier conduction of surface states for CoSi, in accordance with embodiments of the present disclosure.

Referring now to FIG. 13B, shown is a diagram 1350 illustrating carrier conduction of surface states for CoSi, in accordance with embodiments of the present disclosure. Specifically, FIG. 13B shows a schematic of topological protection of the surface-state transmission in slabs 1352 with a notch 1354 on the top surface and the bottom surface. Lines 1 and 2 show how electrons are able to move around the notches 1354 with little added resistance.

As shown in FIG. 13B, carrier conduction of surface states preserves at least one quantum of lossless transmission. In the presence of a surface defect, such as notch 1354, the surface-state electrons would bend around the notch 1354, instead of back-scatter. This explains why the resistance-area (RA) product trends down with decreasing thickness, even in the presence of disorder, which is shown in FIGS. 14A and 14B.

Figure 14A:
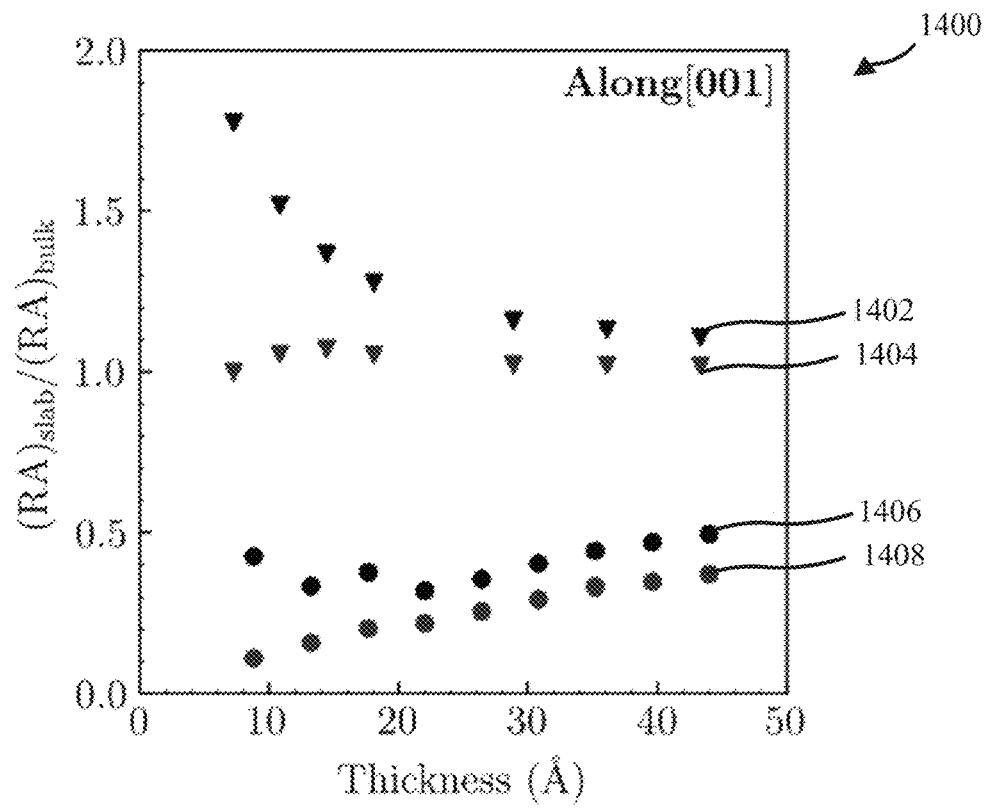
FIG. 14A is a graph illustrating the resistance-area product scaling of Cu and CoSi along the [001] direction at various slab thicknesses, in accordance with embodiments of the present disclosure.

FIG. 14A is a graph 1400 illustrating the resistance-area (RA) product scaling of Cu and CoSi along the [001] direction at various slab thicknesses, in accordance with embodiments of the present disclosure. Specifically, the graph 1400 shows the RA product of CoSi slabs and Cu slabs, with and without a surface notch to simulate strong surface disorder.

In 8-40 atomic-layer (AL) CoSi slabs, $(RA)_{slab}$ is significantly lower than $(RA)_{bulk}$, in sharp contrast to Cu, and it continues to drop till ~2 nm. This holds true regardless of whether the slabs contain a notch. In particular, the CoSi slabs without a notch 1408 have a somewhat smaller $(RA)_{slab}/(RA)_{bulk}$ ratio than CoSi slabs with a notch 1406. However, CoSi slabs with a notch 1406 and without a notch 1408 have a considerably smaller $(RA)_{slab}/(RA)_{bulk}$ ratio than Cu slabs with a notch 1402 or Cu slabs without a notch 1404.

Figure 14B:
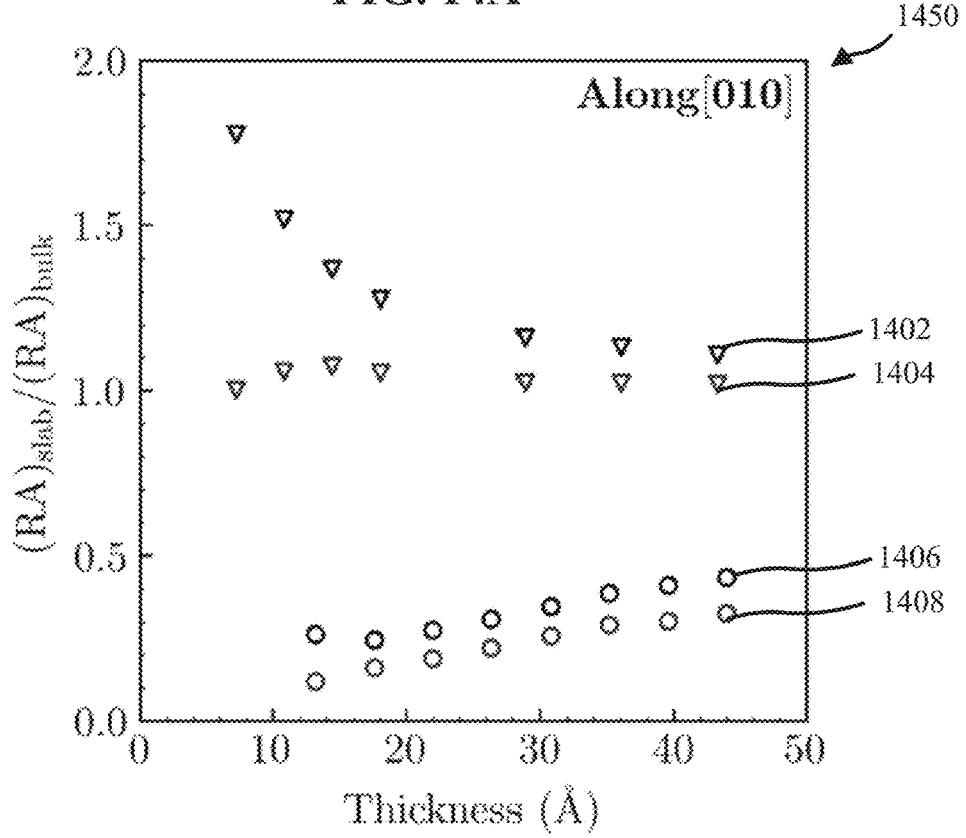
FIG. 14B is a graph illustrating the resistance-area product scaling of Cu and CoSi along the [010] direction at various slab thicknesses, in accordance with embodiments of the present disclosure.

This relationship between slab RA and bulk RA also holds true in other transport directions, such as along [010], as shown in the graph 1450 in FIG. 14B.

Figure 15:
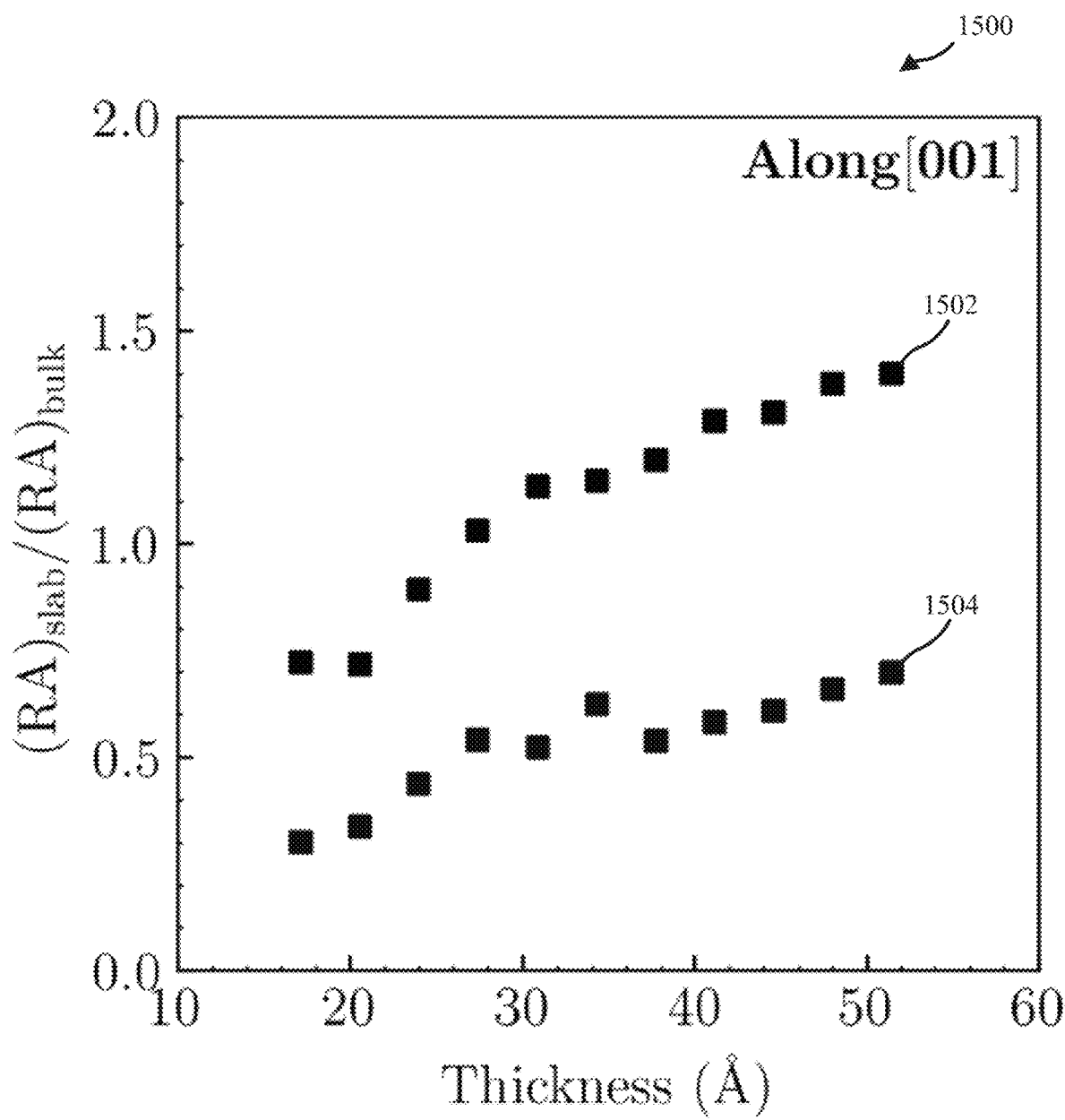
FIG. 15 is a graph illustrating the resistance-area product scaling of TaAs along the direction at various slab thicknesses, in accordance with embodiments of the present disclosure.

FIG. 15 is a graph 1500 illustrating the resistance-area product scaling of TaAs, with and without notches, along the [001] direction at various slab thicknesses, in accordance with embodiments of the present disclosure. As shown in FIG. 15, TaAs, a Weyl semi-metal, exhibits improved characteristics compared to Cu (shown in FIGS. 14A and 14B) at small slab thicknesses, with the $(RA)_{slab}/(RA)_{bulk}$ ratio of TaAs generally falling between CoSi and Cu. This is especially true of TaAs without a notch, as shown by data points 1504. Even with a notch (as shown by data points 1502), TaAs shows comparable, and sometimes better, $(RA)_{slab}/(RA)_{bulk}$ ratio than Cu at smaller slab thicknesses.

Figure 13B:
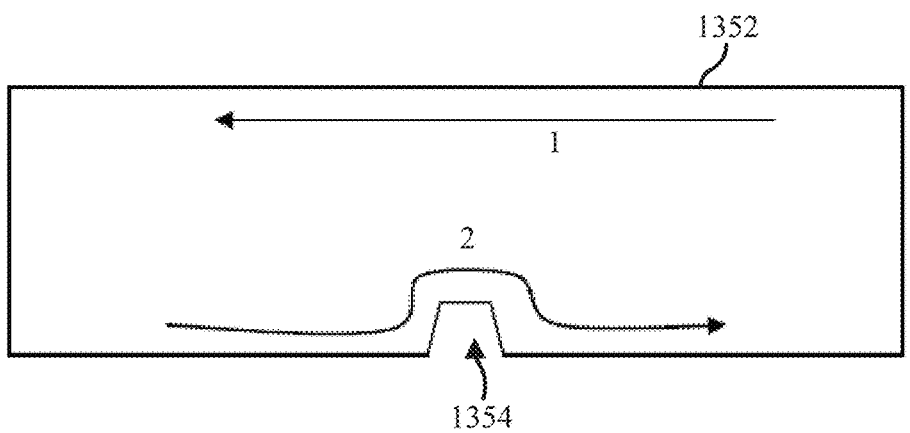
Figure 16:
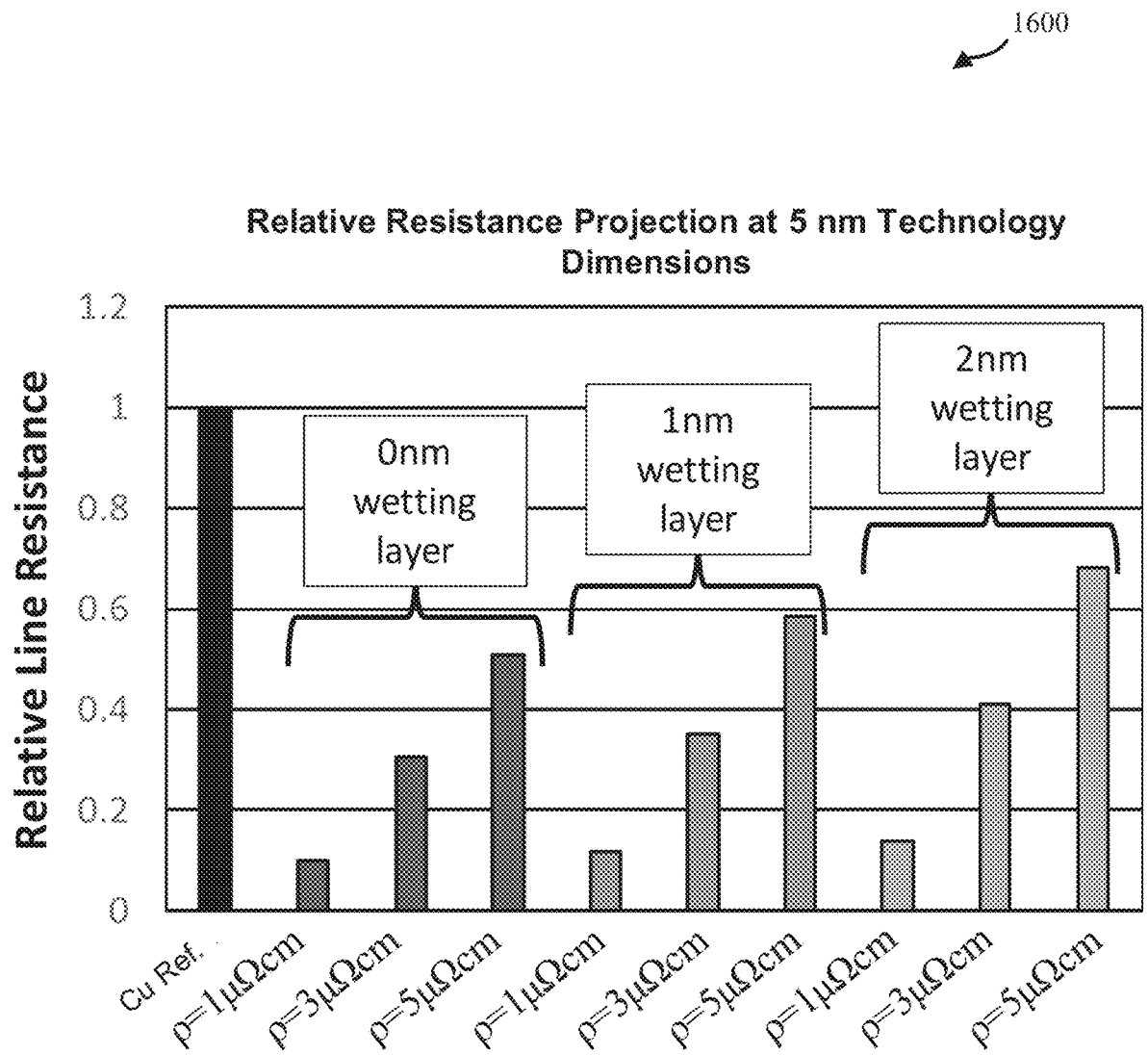
FIG. 16 is a graph showing relative line resistance projections for 5 nm technology nodes using topological semimetal interconnects as compared to copper interconnects, in accordance with embodiments of the present disclosure.
Figure 17:
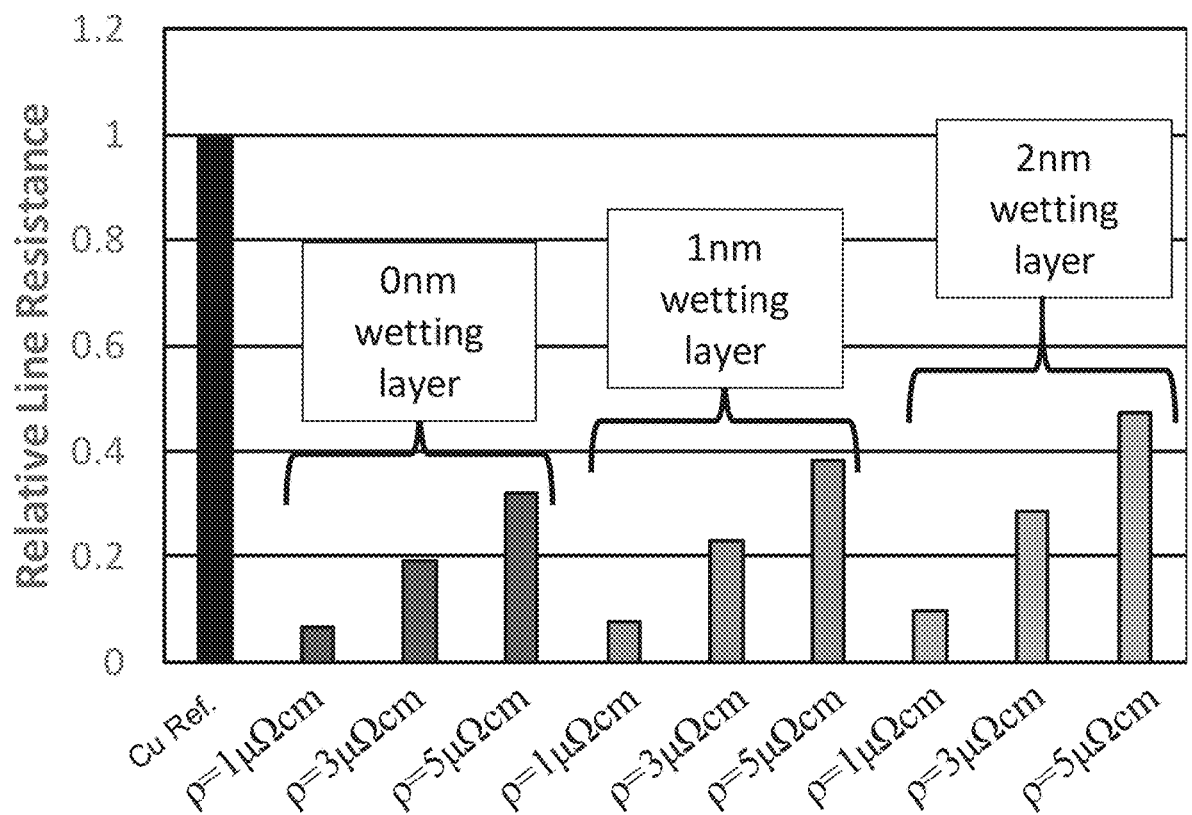
FIG. 17 is a graph showing relative line resistance projections for 3 nm technology nodes using topological semimetal interconnects as compared to copper interconnects, in accordance with embodiments of the present disclosure.

As a result of the different characteristics of semi-metals discussed with respect to FIGS. 13-15, topological semi-metal interconnects have reduced line resistances when compared to traditional Cu interconnects. This is shown in FIGS. 16 and 17. Referring first to FIG. 16, illustrated is a graph 1600 showing relative line resistance projections for 5 nm technology nodes using topological semi-metal NbAs interconnects as compared to copper interconnects, in accordance with embodiments of the present disclosure. FIG. 16 assumes a 5 nm node dimension with a 30 nm BEOL pitch. For Cu, FIG. 16 also assumes that there is a 2 nm PVD TaN barrier layer and a 2 nm CVD Co wetting layer, with the line resistance for Cu being approximately normalized to 1.

The graph 1600 also includes the projected relative line resistances of topological semi-metals (in this case, NbAs) under various conditions. Specifically, the graph 1600 shows the projected line resistances of topological semi-metals with resistivity ($\rho$) in the range of 1 $\mu\Omega$-cm to 5 $\mu\Omega$-cm. This range is consistent with experimental values for NbAs topological semi-metals. Additionally, the graph 1600 shows these projected line resistances with various wetting layer requirements, ranging from a 0 nm wetting layer to a 2 nm wetting layer, which is consistent with expected requirements. Specific wetting layer requirements may depend on various aspects of a given implementation, including, for example, which specific topological semi-metal is used.

As shown in FIG. 16, for 5 nm node dimensions, the use of NbAs in interconnects instead of Cu can reduce the line RC to between approximately 10% (with $\rho=1$ $\mu\Omega$-cm and a 0 nm wetting layer) and 60% (conservative, with $\rho=5$ $\mu\Omega$-cm and a 2 nm wetting layer) of the line resistance of a 5 nm Cu wire.

Referring now to FIG. 17, illustrated is a graph 1700 showing relative line resistance projections for 3 nm technology nodes using topological semi-metal NbAs interconnects as compared to copper interconnects, in accordance with embodiments of the present disclosure. The graph 1700 includes the same assumptions as the graph 1600 in FIG. 16. As shown in FIG. 17, for 3 nm node dimensions, the use of NbAs in interconnects instead of Cu can reduce the line resistance to between approximately 6% (with $\rho=1$ $\mu\Omega$-cm and a 0 nm wetting layer) and 47% (conservative, with $\rho=5$ $\mu\Omega$-cm and a 2 nm wetting layer) of the line resistance of a 3 nm Cu wire.

Figure 18:
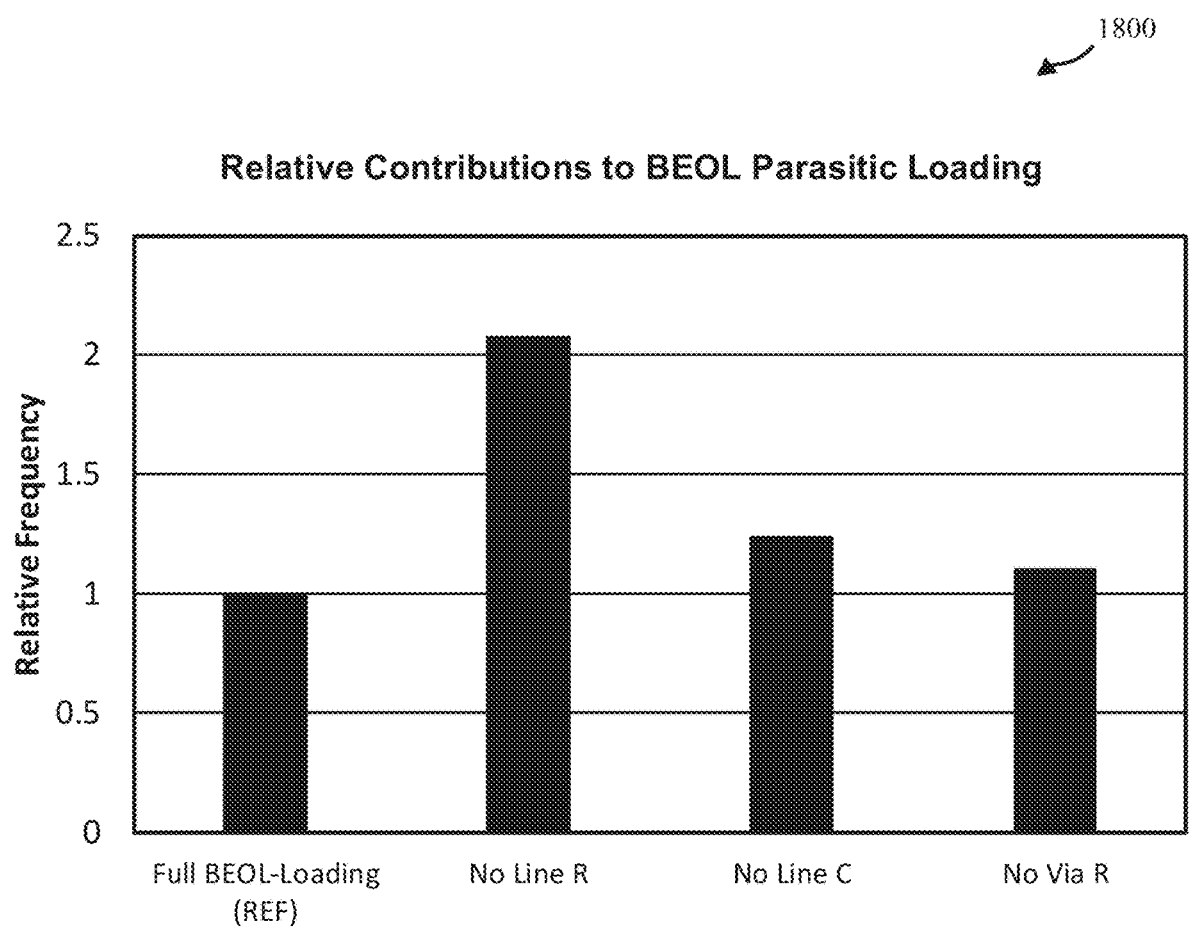
FIG. 18 is a graph showing the relative contributions of line resistance, line capacitance, and via resistance to the total back-end-of-line (BEOL) loading, in accordance with embodiments of the present disclosure.

FIG. 18 is a graph 1800 showing the relative contributions of line resistance, line capacitance, and via resistance to the total back-end-of-line (BEOL) loading, in accordance with embodiments of the present disclosure. As shown in FIG. 18, there are 3 contributors to BEOL parasitic loading, which ultimately limit chip performance: line resistance, line capacitance, via resistance. Performance (quantified in terms of frequency) is most sensitive to line resistance, followed by line capacitance and lastly by via resistance. Accordingly, eliminating or reducing line resistance can increase chip frequency by more than 2×. Meanwhile, eliminating line capacitance or via resistance only increases chip frequency by ~24% and ~10%, respectively.

Figure 19:
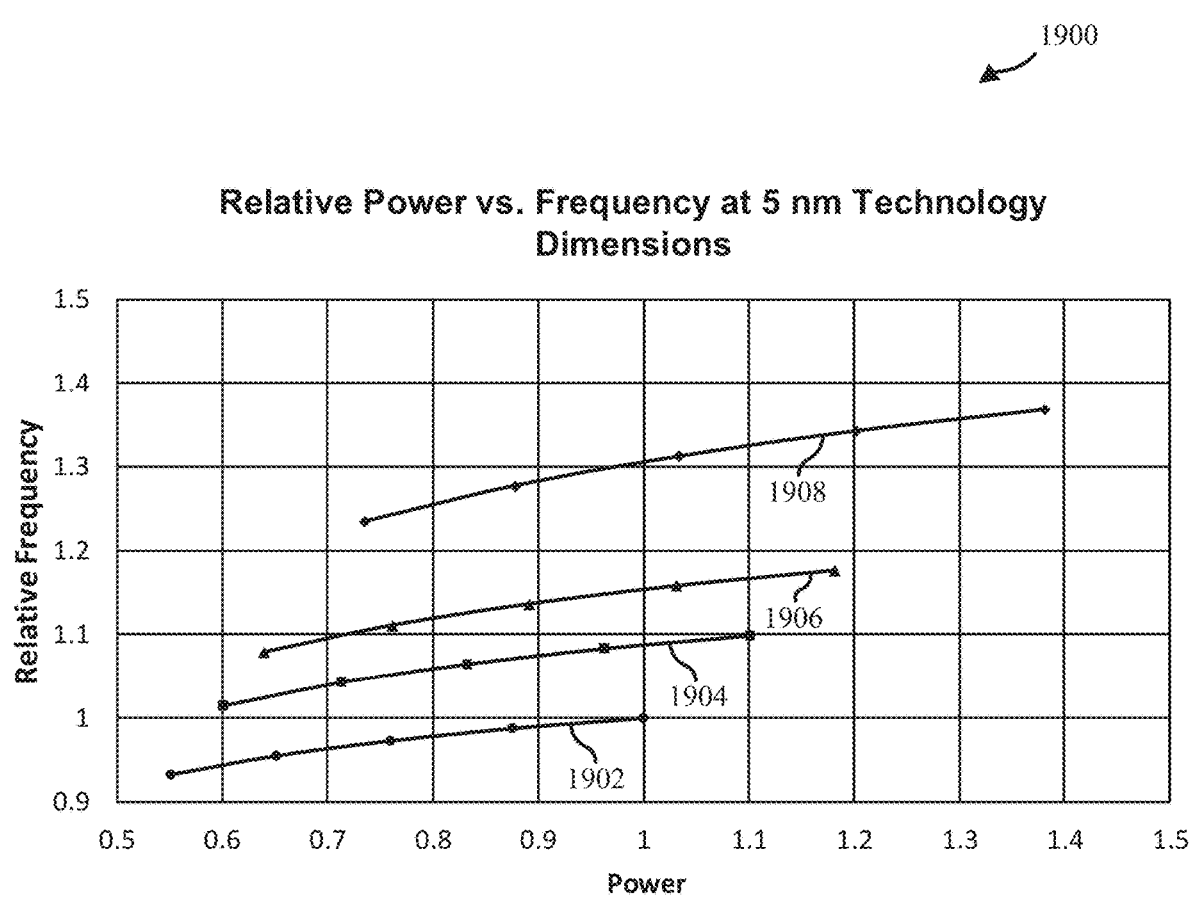
FIG. 19 is a graph showing the effect of reduced line resistance on maximum frequency and power usage, in accordance with embodiments of the present disclosure.
Figure 20:
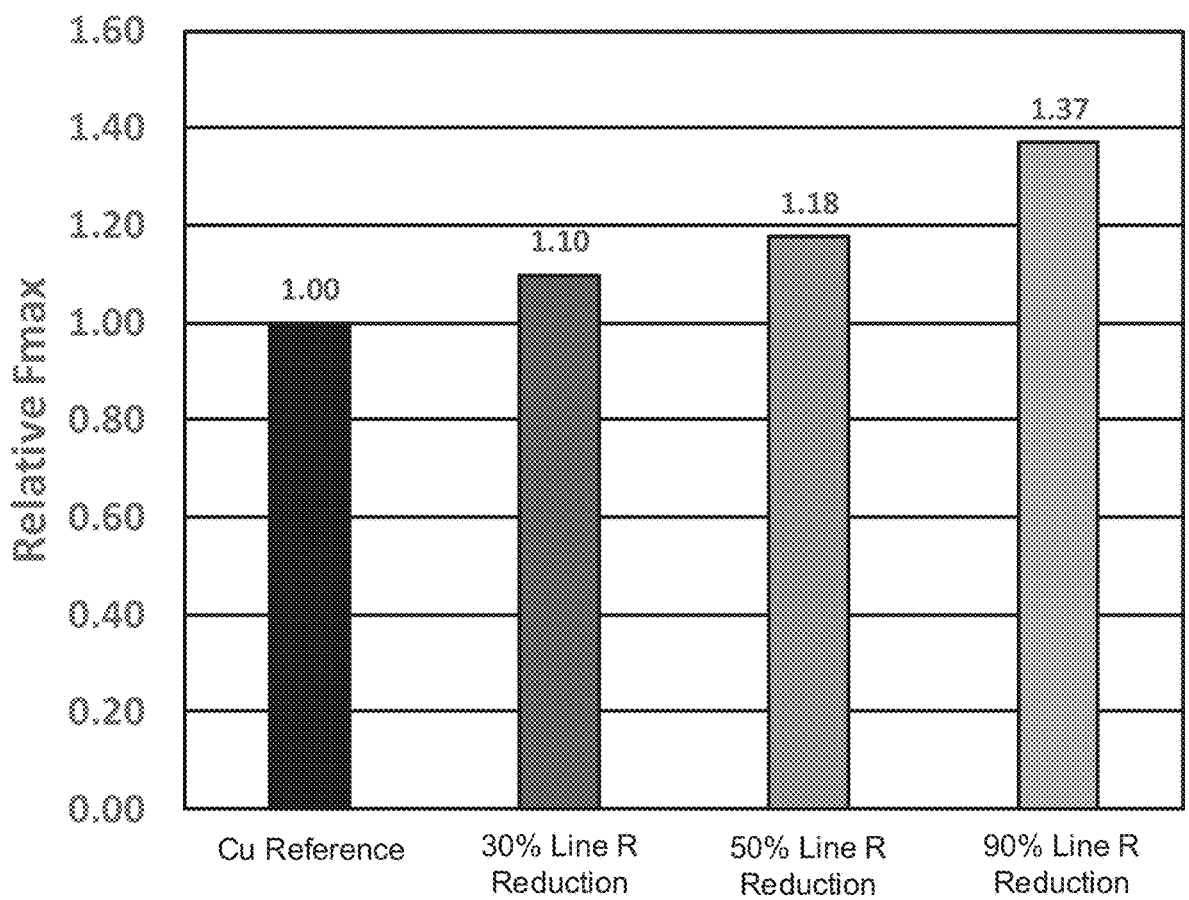
FIG. 20 is a graph showing the relative maximum frequencies attainable using topological semi-metal interconnects as compared to copper interconnects, in accordance with embodiments of the present disclosure.

The effects that a 30%, 50%, and 90% reduction in the line resistance have are shown in FIGS. 19 and 20. In particular, FIGS. 19 and 20 show how the 30%, 50%, and 90% reduction in line resistance that may be attainable using semi-metals (as shown in FIGS. 16-17), along with the fact that line resistance is the primary contributor to full BEOL parasitic loading (as shown in FIG. 18), can result in a substantial performance boost.

Referring first to FIG. 19, illustrated is a graph 1900 showing the effect of reduced line resistance on maximum frequency and power usage, in accordance with embodiments of the present disclosure. In particular, the power vs. frequency lines are shown for the Cu reference 1902, a 30% line resistance reduction 1904, a 50% line resistance reduction 1906, and a 90% line resistance reduction 1908. The graphs have been normalized such that the frequency of Cu at maximum operational power is 1, and the maximum operational power of Cu is also 1.

Referring now to FIG. 20, illustrated is a graph 2000 showing the relative maximum frequencies attainable using topological semi-metal interconnects as compared to copper interconnects, in accordance with embodiments of the present disclosure. In particular, the graph 2000 shows the maximum frequency uplift of a 30% line resistance reduction, a 50% line resistance reduction, and a 90% line resistance reduction, as compared to a normalized Cu reference.

As shown in FIGS. 19 and 20, the performance impact of a 30-50% line resistance reduction at 5 nm is a 10-18% uplift in frequency at isopower (i.e., when compared to a fixed value of chip power consumption). Meanwhile, a 90% reduction in line resistance at 5 nm results in a 37% uplift in frequency at isopower. Accordingly, the performance of semiconductor chips can be substantially increased using topological semi-metals instead of Cu for BEOL interconnects.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of example embodiments of the various embodiments, reference was made to the accompanying drawings (where like numbers represent like elements), which form a part hereof, and in which is shown by way of illustration specific example embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

As used herein, "a number of" when used with reference to items, means one or more items. For example, "a number of different types of networks" is one or more different types of networks.

When different reference numbers comprise a common number followed by differing letters (e.g., 100a, 100b, 100c) or punctuation followed by differing numbers (e.g., 100-1, 100-2, or 100.1, 100.2), use of the reference character only without the letter or following numbers (e.g., 100) may refer to the group of elements as a whole, any subset of the group, or an example specimen of the group.

Further, the phrase "at least one of," when used with a list of items, means different combinations of one or more of the listed items can be used, and only one of each item in the list may be needed. In other words, "at least one of" means any combination of items and number of items may be used from the list, but not all of the items in the list are required. The item can be a particular object, a thing, or a category.

For example, without limitation, "at least one of item A, item B, or item C" may include item A, item A and item B, or item B. This example also may include item A, item B, and item C or item B and item C. Of course, any combinations of these items can be present. In some illustrative examples, "at least one of" can be, for example, without limitation, two of item A; one of item B; and ten of item C; four of item B and seven of item C; or other suitable combinations.

In the foregoing, reference is made to various embodiments. It should be understood, however, that this disclosure is not limited to the specifically described embodiments. Instead, any combination of the described features and elements, whether related to different embodiments or not, is contemplated to implement and practice this disclosure. Many modifications, alterations, and variations may be apparent to those of ordinary skill in the art without departing from the scope and spirit of the described embodiments. Furthermore, although embodiments of this disclosure may achieve advantages over other possible solutions or over the prior art, whether or not a particular advantage is achieved by a given embodiment is not limiting of this disclosure. Thus, the described aspects, features, embodiments, and advantages are merely illustrative and are not considered elements or limitations of the appended claims except where explicitly recited in a claim(s). Additionally, it is intended that the following claim(s) be interpreted as covering all such alterations and modifications as fall within the true spirit and scope of the invention.

What is claimed is:

1. A semiconductor device comprising one or more back-end-of-line interconnects, each of the one or more back-end-of-line interconnects having a conductor portion that includes non-magnetic, non-centrosymmetric Weyl semi-metal.

2. The semiconductor device of claim 1, wherein the one or more back-end-of-line interconnects connect individual semiconductor devices to create one or more integrated circuits.

3. The semiconductor device of claim 1, wherein the non-magnetic, non-centrosymmetric Weyl semi-metal is a semi-metal selected from the group consisting of TaAs, TaP, NbAs, (Mo,W)Te$_2$, LaAlGe, and TaIrTe$_4$.

4. An interconnect comprising a conductor layer adapted to electrically connect two or more devices, the conductor layer comprising a topological semi-metal conductor core, the topological semi-metal being a non-magnetic, non-centrosymmetric Weyl semi-metal.

5. The interconnect of claim 4, wherein the Fermi Energy of the topological semi-metal conductor fill is within 25 meV of the energy of its Weyl nodes.

6. The interconnect of claim 4, wherein a thickness of the topological semi-metal conductor fill is between 1 nm and 100 nm.

7. The interconnect of claim 4, wherein a thickness of the topological semi-metal conductor fill is between 3 nm and 10 nm.

8. The interconnect of claim 4, wherein the interconnect is one of a group consisting of a wire and a via.

9. The interconnect of claim 4, wherein the topological semi-metal is a semi-metal selected from the group consisting of TaAs, TaP, NbAs, (Mo,W)Te$_2$, LaAlGe, and TaIrTe$_4$.

* * * * *